(12) United States Patent
Watanabe et al.

(10) Patent No.: US 9,892,950 B2
(45) Date of Patent: *Feb. 13, 2018

(54) CERAMIC MEMBER, MEMBER FOR SEMICONDUCTOR MANUFACTURING APPARATUS, AND METHOD FOR MANUFACTURING CERAMIC MEMBER

(71) Applicant: NGK Insulators, Ltd., Nagoya (JP)

(72) Inventors: Morimichi Watanabe, Nagoya (JP); Asumi Jindo, Okazaki (JP); Yuji Katsuda, Tsushima (JP); Yosuke Sato, Hashima-Gun (JP); Yoshinori Isoda, Ichinomiya (JP); Atsushi Watanabe, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 487 days.

This patent is subject to a terminal disclaimer.

(21) Appl. No.: 14/246,639

(22) Filed: Apr. 7, 2014

(65) Prior Publication Data
US 2014/0290863 A1 Oct. 2, 2014

Related U.S. Application Data

(63) Continuation of application No. PCT/JP2012/076176, filed on Oct. 10, 2012.

(30) Foreign Application Priority Data

Oct. 11, 2011 (JP) .................... 2011-223851

(51) Int. Cl.
*H01L 21/683* (2006.01)
*C04B 35/58* (2006.01)
*C04B 35/053* (2006.01)

(52) U.S. Cl.
CPC ........ *H01L 21/6831* (2013.01); *C04B 35/053* (2013.01); *C04B 35/58* (2013.01);
(Continued)

(58) Field of Classification Search
USPC ................ 156/345.52; 361/234; 279/128
See application file for complete search history.

(56) References Cited

U.S. PATENT DOCUMENTS 6,239,402 B1 5/2001 Araki et al.
6,447,937 B1 9/2002 Murakawa et al.
(Continued)

FOREIGN PATENT DOCUMENTS

JP 04-099146 A1 3/1992
JP 07-309667 A1 11/1995
(Continued)

OTHER PUBLICATIONS

English Translation of JP 2000-44345. Published Feb. 2000.*
(Continued)

*Primary Examiner* — Sylvia R MacArthur
(74) *Attorney, Agent, or Firm* — Burr & Brown, PLLC

(57) ABSTRACT

A ceramic member 30 according to the present invention includes a ceramic base 32, which contains a solid solution Mg(Al)O(N) in which Al and N components are dissolved in magnesium oxide as the main phase, and an electrode 34 disposed on a portion of the ceramic base 32 and containing at least one of nitrides, carbides, carbonitrides, and metals as an electrode component. The ceramic base 32 may have an XRD peak of a (111), (200), or (220) plane of Mg(Al)O(N) measured using a CuKα ray at 2θ=36.9 to 39, 42.9 to 44.8, or 62.3 to 65.2 degrees, respectively, between a magnesium oxide cubic crystal peak and an aluminum nitride cubic crystal peak.

15 Claims, 6 Drawing Sheets

(52) U.S. Cl.
CPC ........... *C04B 2235/3217* (2013.01); *C04B 2235/3222* (2013.01); *C04B 2235/3865* (2013.01); *C04B 2235/6586* (2013.01); *C04B 2235/76* (2013.01); *C04B 2235/77* (2013.01); *C04B 2235/80* (2013.01); *C04B 2235/9607* (2013.01); *H01L 21/6833* (2013.01)

(56) References Cited

U.S. PATENT DOCUMENTS

| | | | | |
|---|---|---|---|---|
| 8,541,328 | B2* | 9/2013 | Watanabe | C04B 35/581 501/96.1 |
| 8,597,776 | B2* | 12/2013 | Watanabe | C04B 35/581 204/298.13 |
| 9,177,847 | B2* | 11/2015 | Watanabe | H01L 21/6833 |
| 2010/0104892 | A1* | 4/2010 | Kobayashi | C04B 35/581 428/698 |
| 2012/0231243 | A1* | 9/2012 | Watanabe | C04B 35/581 428/212 |
| 2012/0231945 | A1 | 9/2012 | Watanabe et al. | |
| 2013/0235507 | A1 | 9/2013 | Aikawa et al. | |
| 2014/0290863 | A1* | 10/2014 | Watanabe | C04B 35/58 156/345.52 |

FOREIGN PATENT DOCUMENTS

| | | |
|---|---|---|
| JP | 10-154834 A1 | 6/1998 |
| JP | 2000-044345 A1 | 2/2000 |
| JP | 3559426 B2 | 9/2004 |
| JP | 2007-084367 A1 | 4/2007 |
| JP | 2009-292688 A1 | 12/2009 |
| JP | 5680644 B2 | 3/2015 |
| JP | 5683602 B2 | 3/2015 |
| WO | 2012/056918 A1 | 5/2012 |

OTHER PUBLICATIONS

Molybdenum. Found at www.wikipedia.com date of publishing unknown.*
International Search Report and Written Opinion dated Jan. 15, 2013.
Japanese Office Action, Japanese Application No. 2013-538550, dated Jul. 5, 2016 (5 pages).

* cited by examiner

CERAMIC MEMBER, MEMBER FOR SEMICONDUCTOR MANUFACTURING APPARATUS, AND METHOD FOR MANUFACTURING CERAMIC MEMBER

FIELD OF THE INVENTION

The present invention relates to a ceramic member, a member for a semiconductor manufacturing apparatus, and a method for manufacturing the ceramic member.

BACKGROUND OF THE INVENTION

Reactive plasma of a halogen, such as F or Cl, for etching or cleaning is used in a semiconductor manufacturing apparatus for use in a dry process or plasma coating in semiconductor manufacturing. Thus, members for use in such a semiconductor manufacturing apparatus require high corrosion resistance and generally include members composed of corrosion-resistant metals, such as Al subjected to alumite treatment and Hastelloy, and ceramics. In particular, electrostatic chuck members and heater members for supporting and fixing a Si wafer require high corrosion resistance and low dusting and are therefore made of corrosion-resistant ceramics, such as aluminum nitride, alumina, and sapphire. These materials are gradually corroded in long-term use and generate dust. Thus, there is a demand for higher corrosion-resistant materials. Mg compounds magnesium oxide and spinel are known to have higher corrosion resistance to halogen plasma than alumina. In particular, the corrosion resistance increases with the magnesium oxide content (for example, Patent Literature 1).

However, magnesium oxide reacts with water and carbon dioxide in the air and forms hydroxide and carbonate. Thus, the surface of magnesium oxide gradually deteriorates (a moisture resistance problem). When magnesium oxide is used in a member for a semiconductor manufacturing apparatus, therefore, semiconductor devices may be contaminated by decomposition gases of the hydroxide and carbonate or by magnesium oxide particles or dust formed by the decomposition of the hydroxide and carbonate. This retards the practical application of magnesium oxide. In order to improve the moisture resistance of magnesium oxide, a method utilizing solid solution of NiO or ZnO in magnesium oxide has been proposed (see, for example, Patent Literature 2).

CITATION LIST

Patent Literature

PTL 1: JP 3559426 B
PTL 2: JP2009-292688 A

SUMMARY OF THE INVENTION

Technical Problem

However, a metal component, such as NiO or ZnO, added to the ceramic base in Patent Literature 2 becomes a pollutant that affects the characteristics of semiconductor devices and is therefore unfavorable as an additive agent. Thus, there is a demand for a chemically more stable material.

In such ceramic members, an electrode is sometimes buried in or disposed on the ceramic base. In a novel magnesium oxide material having improved water resistance and moisture resistance, the reactivity of the material to an electrode is unknown, and cracking or poor bonding may occur between the base and an electrode. Use of such a material in a member for a semiconductor manufacturing apparatus may cause dielectric breakdown. When an electrode is buried in the base, the base and the electrode may be cofired. In such a case, the electrode must have a high melting point such that the electrode can withstand exposure to the firing temperature of the base. The difference in thermal expansion coefficient between the base and the electrode must be reduced in order to prevent cracking. In a generally known method for reducing the difference in thermal expansion coefficient between the base and an electrode, a filler component is added to the electrode. However, an electrode containing an excessive amount of filler component may have insufficient electrical conductivity. In particular, novel materials based on magnesium oxide generally have a relatively high thermal expansion coefficient, and electrodes must also have a comparably high thermal expansion coefficient. Electrodes used for magnesium oxide are generally made of Pt, Pd, Ir, or Au (Japanese Unexamined Patent Application Publication No. 10-154834). These electrodes are formed on a magnesium oxide base by sputtering. Thus, it is not clear whether cofiring causes a problem. Furthermore, Pt is very expensive and increases the manufacturing costs of the member. Thus, there is a demand for electrode materials that are more suitable for novel materials having improved corrosion resistance and moisture resistance.

In order to solve such problems, it is a principal object of the present invention to provide a chemically more stable ceramic member including a more suitable electrode, a member for a semiconductor manufacturing apparatus, and a method for manufacturing the ceramic member.

Solution to Problem

As a result of extensive studies to achieve the principal object, the present inventors completed the present invention by finding that a more suitable and chemically more stable ceramic member can be provided by providing a ceramic base containing a solid solution in which Al and N components are dissolved in magnesium oxide (hereinafter also referred to as Mg(Al)O(N)) with an electrode containing any of nitrides, carbides, carbonitrides, and metals as an electrode component.

A ceramic member according to the present invention includes a ceramic base, which contains a solid solution Mg(Al)O(N) in which Al and N components are dissolved in magnesium oxide as the main phase, and an electrode disposed on a portion of the ceramic base and containing any of nitrides, carbides, carbonitrides, and metals as an electrode component.

A member for a semiconductor manufacturing apparatus according to the present invention includes the ceramic member.

A method for manufacturing the ceramic member according to the present invention includes cofiring of a compact that contains an electrode raw material containing any of nitrides, carbides, carbonitrides, and metals disposed on a portion of a ceramic raw material containing Mg, O, Al, and N components.

Advantageous Effects of Invention

A ceramic member, a member for a semiconductor manufacturing apparatus, and a method for manufacturing the ceramic member according to the present invention include a more suitable electrode and are chemically more stable. This is probably because of the reason described below. A ceramic base according to the present invention containing Al and N components as well as Mg and O in the crystal structure of magnesium oxide has substantially the same corrosion resistance as magnesium oxide and higher moisture resistance and water resistance than magnesium oxide. Thus, a member for a semiconductor manufacturing apparatus containing such a ceramic member can withstand exposure to reactive plasma of a halogen, such as F or Cl, used in a semiconductor manufacturing process for a long time and produce a smaller amount of dust. Because of its high moisture resistance and water resistance, the member is more resistant to deterioration than common magnesium oxide and withstands wet processing. An electrode according to the present invention containing any of nitrides, carbides, carbonitrides, and metals is chemically unreactive to a ceramic base according to the present invention and has an easily-controllable thermal expansion coefficient. Thus, a ceramic member according to the present invention can ensure the electrical conductivity of an electrode and more effectively suppress cracking in the vicinity of the electrode. The term "metals", as used herein, includes alloys.

DETAILED DESCRIPTION OF THE INVENTION

Figure 1:
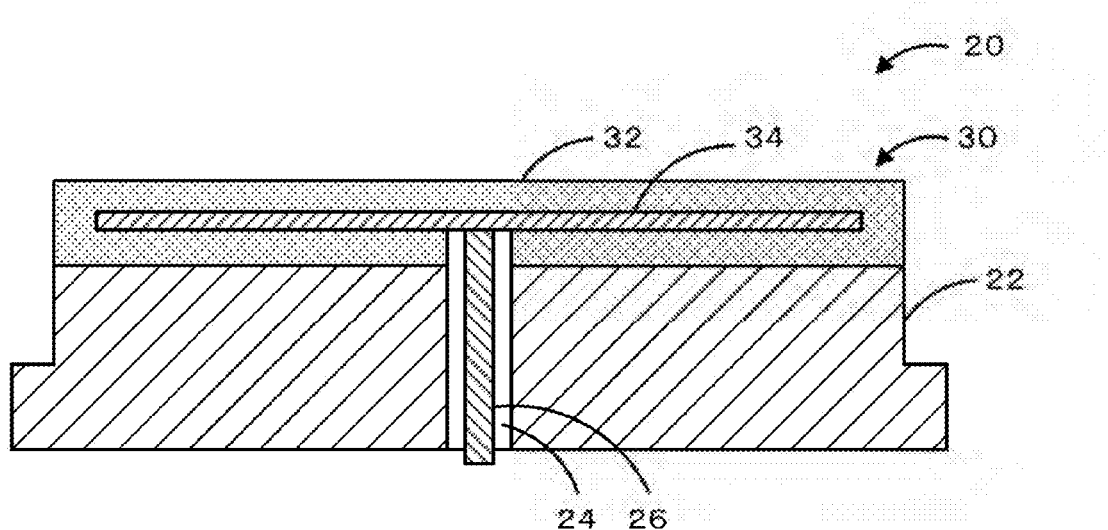
FIG. 1 is a schematic view of a member 20 for a semiconductor manufacturing apparatus according to an embodiment of the present invention.

Embodiments of the present invention will be described below with reference to the accompanying drawings. FIG. 1 is a schematic view of a member 20 for a semiconductor manufacturing apparatus according to an embodiment of the present invention. The member 20 for a semiconductor manufacturing apparatus includes a base material portion 22 and a ceramic member 30 disposed on the base material portion 22. The base material portion 22 of the member 20 for a semiconductor manufacturing apparatus has a through-hole 24, in which a rod-like electric supply member 26 is disposed. The base material portion 22 may include a heater for heating the ceramic member 30. The ceramic member 30 according to the present invention includes a ceramic base 32, which contains a solid solution Mg(Al)O(N) in which Al and N components are dissolved in magnesium oxide as the main phase, and an electrode 34 disposed on a portion of the ceramic base 32 and containing at least one of nitrides, carbides, carbonitrides, and metals as an electrode component (electrically conductive material component). The ceramic member 30 is a flat member and includes the electrode 34 buried therein. The electrode 34 is connected to the electric supply member 26, which is inserted from the lower side of the ceramic member 30, and is supplied with electric power through the electric supply member 26. A ceramic member according to the present invention will be described below.

A ceramic base according to the present invention is mainly composed of Mg, Al, O, and N and contains a Mg(Al)O(N) crystal phase, which is a solid solution in which Al and N components are dissolved in magnesium oxide, as the main phase. The Mg(Al)O(N) has substantially the same corrosion resistance as magnesium oxide and higher moisture resistance and water resistance than magnesium oxide. Thus, the ceramic base containing the Mg(Al)O(N) crystal phase as the main phase has high corrosion resistance, moisture resistance, and water resistance. In a ceramic base according to the present invention, aluminum nitride or alumina can be added to magnesium oxide to significantly increase the amounts of Al and N components dissolved in the solid solution. Thus, the Mg(Al)O(N) may contain more Al than N in the solid solution.

The Mg(Al)O(N) may have an XRD peak of a (100), (200), or (220) plane measured using a CuKα ray at 2θ=36.9 to 39, 42.9 to 44.8, or 62.3 to 65.2 degrees, respectively, between a magnesium oxide cubic crystal peak and an aluminum nitride cubic crystal peak. Although these XRD peaks appear in these ranges, these XRD peaks are sometimes difficult to discriminate from the other crystal phase peaks. Thus, at least one of these XRD peaks may be observed in these ranges. The moisture resistance and water resistance increase with increasing amounts of Al and N components dissolved in the solid solution. With an increase in the amounts of Al and N components dissolved in the solid solution, the XRD peaks of magnesium oxide shift toward higher angles. Thus, the XRD peaks of the (200) plane and the (220) plane of the Mg(Al)O(N) at 2θ=42.92 degrees or more and 62.33 degrees or more, respectively, are preferred in terms of moisture resistance. The XRD peaks of the (200) plane and the (220) plane of the Mg(Al)O(N) at 2θ=42.95 degrees or more and 62.35 degrees or more, respectively, are preferred in terms of moisture resistance and water resistance. The XRD peaks of the (200) plane and the (220) plane of the Mg(Al)O(N) at 2θ=43.04 degrees or more and 62.50 degrees or more, respectively, are more preferred in terms of moisture resistance and water resistance. The XRD peaks of the (200) plane and the (220) plane of the Mg(Al)O(N) at 2θ=43.17 degrees or more and 62.72 degrees or more, respectively, are more preferred in terms of water resistance as well as moisture resistance. It was also found that the water resistance increases with decreasing integral width of the Mg(Al)O(N). The integral width of an XRD peak of the (200) plane of the Mg(Al)O(N) is preferably 0.50 degrees or less, more preferably 0.35 degrees or less, in terms of water resistance.

When a ceramic base according to the present invention contains an AlN crystal phase as a subphase, the ceramic base tends to have low corrosion resistance. Thus, a ceramic base according to the present invention preferably contains a smaller amount of AlN crystal phase and more preferably contains no AlN crystal phase.

A ceramic base according to the present invention may contain a Mg—Al oxynitride phase as a subphase. The Mg—Al oxynitride phase has at least an XRD peak at 2θ=47 to 49 degrees measured using a CuKα ray. Since Mg—Al oxynitride also has high corrosion resistance, a ceramic base according to the present invention may contain Mg—Al oxynitride as a subphase without problems. A higher Mg—Al oxynitride phase content results in improved mechanical characteristics. In particular, the Mg—Al oxynitride phase effectively improves the strength and fracture toughness of the ceramic base. However, the Mg—Al oxynitride phase has lower corrosion resistance than Mg(Al)O(N) according to the present invention. Thus, the Mg—Al oxynitride phase content is limited in terms of corrosion resistance. The ratio A/B of the XRD peak intensity A of the Mg—Al oxynitride phase at 2θ=47 to 49 degrees to the XRD peak intensity B of the (220) plane of the Mg(Al)O(N) at 2θ=62.3 to 65.2 degrees is preferably 0.03 or more. This can further increase the mechanical characteristics of the ceramic base. The A/B is preferably 0.14 or less in terms of corrosion resistance.

The Mg/Al molar ratio of a mixed powder of a ceramic base according to the present invention is preferably 0.5 or more.

The open porosity in a ceramic base according to the present invention is preferably 5% or less. The open porosity is measured in accordance with Archimedes' principle using pure water as a medium. A open porosity of more than 5% may result in a decrease in strength, dusting of the material because of falling of grains, or accumulation of a dust component in the pores during material processing. The open porosity is preferably close to zero. Thus, the percentage of open pores has no particular lower limit.

The thermal expansion coefficient of a ceramic base according to the present invention is preferably 9 ppm/K or more and 14 ppm/K or less, more preferably 10 ppm/K or more and 13 ppm/K or less. The thermal expansion coefficient of a ceramic base depends on the blend ratio of Mg, O, Al, and N. For example, a ceramic base rich in Mg tends to have higher corrosion resistance and a higher thermal expansion coefficient. A ceramic base containing less Mg tends to have slightly lower corrosion resistance and a lower thermal expansion coefficient. At the blend ratio of Mg, O, Al, and N components that can achieve desired characteristics, the thermal expansion coefficient is preferably 9 ppm/K or more and 14 ppm/K or less.

An electrode according to the present invention contains at least one of nitrides, carbides, carbonitrides, and metals as an electrode component and may contain at least one of nitrides, carbides, carbonitrides, and metals containing at least one of group 4 to 6 elements as an electrode component. The metals may include alloys. More specifically, the electrode may have a melting point of 1650° C. or more and contain at least on of nitrides, carbides, carbonitrides, metals, and alloys containing at least one of Ti, Zr, Hf, V, Nb, Ta, Cr, Mo, W, Ru, Ir, Pt, and Rh as an electrode component. Among these, Ti, Zr, Nb, Ta, Cr, Mo, W, Ru, and Ir are preferred, and Ti, Nb, and Cr are preferred in terms of the thermal expansion coefficient of a ceramic base. Although noble metals, such as Ru and Ir, are expensive, noble metals are preferred because they more effectively suppress cracking in the vicinity of the electrode while ensuring the electrical conductivity of the electrode. Examples of the nitrides include NbN, TiN, and ZrN. The nitrides also include complex nitrides, such as $Ti_2AlN$. Examples of the carbides include WC, TaC, ZrC, TiC, NbC, and $Mo_2C$. The carbides also include complex carbides, such as $Ti_2AlC$, $Ti_2InC$, $Ti_2SnC$, $V_2AlC$, and $Zr_2SnC$. The carbonitrides include compositions containing C and N at any ratio, such as $NbC_xN_{1-x}$ (0<x<1; the same applies hereinafter) and $TiC_xN_{1-x}$. Examples of the metals include Nb, Cr, Mo, and W. The metals also include intermetallic compounds, such as $Nb_3Al$ and $Mo_3Al$. Among these, NbN, TiN, ZrN, TaC, ZrC, TiC, NbC, WC, $Mo_2C$, Nb, Cr, Mo, W, Ru, and Ir are preferred. The electrode may contain an element other than the group 4 to 6 elements as an electrode component as in $Ti_2AlN$ or $Nb_3Al$.

The electrode component in an electrode according to the present invention preferably has substantially the same thermal expansion coefficient as the ceramic base and more preferably has a thermal expansion coefficient in the range of 9 to 14 ppm/K.

An electrode according to the present invention may be in the form of a plate, net, line, or coil. An electrode according to the present invention may contain an electrode component and a filler component containing Mg and O. The filler component containing Mg and O is preferred because a small amount of filler component containing Mg and O can increase the thermal expansion coefficient of the electrode. The filler component is preferably a substance having a higher thermal expansion coefficient than the electrode component. This allows the difference in thermal expansion coefficient between the electrode and the ceramic base to be controlled with the filler component. Furthermore, sintering between the filler component and the ceramic base can increase the adhesion strength between the ceramic base and the electrode. The filler component is not particularly limited, provided that the filler component contains Mg and O, and may be magnesium oxide or Mg(Al)O(N). An electrode component having a thermal expansion coefficient of 4 ppm/K or more can be used by controlling the addition of the filler component. In order to suppress the increase in resistance of the electrode, the amount of filler component to be added is preferably minimized. For example, the amount of filler component to be added is preferably 60% by volume or less, more preferably 50% by volume or less, of the total amount of the electrode component and the filler component. In order to reduce the amount of filler component to be added, the electrode component preferably has a thermal expansion coefficient of 6 ppm/K or more, more preferably 8 ppm/K or more.

The absolute value of the difference in thermal expansion coefficient between the ceramic base and the raw material components of an electrode according to the present invention made of a metal is preferably 3.0 ppm/K or less. The absolute value of the difference in thermal expansion coefficient between the ceramic base and the raw material components of an electrode according to the present invention made of a nitride, carbide, or carbonitride is preferably 2.0 ppm/K or less, more preferably 0.8 ppm/K or less. When the difference in thermal expansion coefficient is 0.8 ppm/K or less, cracking in the vicinity of the electrode is more effectively suppressed. The difference in thermal expansion coefficient is still more preferably 0.6 ppm/K or less, still more preferably 0.4 ppm/K or less. The thermal expansion coefficient of "the raw material components of an electrode" refers to the thermal expansion coefficient of the electrode component in the case that the raw material components of an electrode is only the electrode component or the average thermal expansion coefficient of the electrode component and the filler component considering their volume percentages in the case that the raw material components of an electrode include the electrode component and the filler component. More specifically, in the case that an electrode component NbN having a thermal expansion coefficient of 10.1 ppm/K constitutes 50% by volume of the raw material components of an electrode, and a filler component MgO having a thermal expansion coefficient of 13.9 ppm/K constitutes 50% by volume of the raw material components of the electrode, the average thermal expansion coefficient is $10.1 \times 0.5 + 13.9 \times 0.5 = 12.0$ ppm/K. The difference in thermal expansion coefficient of an electrode containing a filler component is calculated from the average thermal expansion coefficient.

An electrode according to the present invention preferably has a low specific resistance of 10 Ωcm or less. Such an electrode can function as an electrode for electrostatic chucks. The specific resistance is more preferably $1 \times 10^{-1}$ Ωcm or less, still more preferably $1 \times 10^{-3}$ Ωcm or less. Such an electrode can function as an electrode for heaters.

A method for manufacturing a ceramic member according to the present invention will be described below. A method for manufacturing the ceramic member according to any one of the embodiments of the present invention includes cofiring of a compact that contains an electrode raw material containing any of nitrides, carbides, carbonitrides, and metals disposed on a portion of a ceramic raw material containing Mg, O, Al, and N components. In a method for manufacturing the ceramic member according to the present invention, the electrode raw material may be buried in a ceramic raw material, which is the raw material of a ceramic base. In this case, a ceramic member including an electrode buried in a ceramic base can be manufactured. Alternatively, the electrode raw material may be disposed on the outer surface of the ceramic raw material. In this case, a ceramic member including an electrode disposed on the outer surface of a ceramic base can be manufactured. The electrode raw material may be disposed on the surface of a compact of a green ceramic raw material or on the surface of a sintered body of the ceramic raw material. The manufacture of a ceramic member including an electrode buried in a ceramic base may include placing the electrode raw material on the surface of a sintered body serving as a portion of the ceramic base, placing a compact of the ceramic raw material or a ceramic sintered body on the electrode raw material to form a layered body, and firing the layered body. This can more reliably provide a ceramic member including an electrode buried in a ceramic base. Alternatively, the manufacture of a ceramic member including an electrode buried in a ceramic base may include placing the electrode raw material on the surface of a green compact serving as a portion of the ceramic base, placing the ceramic raw material on the electrode raw material to form a layered body, and firing the layered body.

A ceramic base according to the present invention may be manufactured by forming and firing a mixed powder of magnesium oxide, aluminum nitride, and alumina. Preferably, magnesium oxide constitutes 49 mass % or more of the mixed powder of the ceramic base raw material. In terms of corrosion resistance, more preferably, magnesium oxide constitutes 70 mass % or more and 99 mass % or less of the mixed powder composition, aluminum nitride constitutes 0.5 mass % or more and 25 mass % or less of the mixed powder composition, and alumina constitutes 0.5 mass % or more and 25 mass % or less of the mixed powder composition. Still more preferably, magnesium oxide constitutes 70 mass % or more and 90 mass % or less of the mixed powder composition, aluminum nitride constitutes 5 mass % or more and 25 mass % or less of the mixed powder composition, and alumina constitutes 5 mass % or more and 25 mass % or less of the mixed powder composition. In order to satisfy both the mechanical characteristics and the corrosion resistance, preferably, magnesium oxide constitutes 49 mass % or more and 99 mass % or less of the mixed powder composition, aluminum nitride constitutes 0.5 mass % or more and 25 mass % or less of the mixed powder composition, and alumina constitutes 0.5 mass % or more and 30 mass % or less of the mixed powder composition. More preferably, magnesium oxide constitutes 50 mass % or more and 75 mass % or less of the mixed powder composition, aluminum nitride constitutes 5 mass % or more and 20 mass % or less of the mixed powder composition, and alumina constitutes 15 mass % or more and 30 mass % or less of the mixed powder composition.

An electrode according to the present invention may be formed with a slurry or paste (hereinafter referred to simply as a paste), which is prepared by mixing a solvent with an electrode raw material powder containing the electrode component and, if necessary, the filler component. The electrode component may be at least one of nitrides, carbides, carbonitrides, and metals described above. The electrode component may also be a mixture of nitride particles and carbide particles, such as a mixture of TiN and TaC or a mixture of NbN and NbC. The solvent preferably does not affect the function of the ceramic member in the downstream processes and is preferably an organic solvent, such as diethylene glycol monobutyl ether. The electrode paste may contain a binder in addition to the solvent. The binder is preferably an organic binder, such as poly(vinyl butyral). The electrode may be formed by screen printing.

In a method for manufacturing a ceramic member according to the present invention, the firing temperature is preferably 1650° C. or more, more preferably 1700° C. or more. A firing temperature of less than 1650° C. may result in the absence of the intended Mg(Al)O(N) in the ceramic base or the occurrence of cracking or poor bonding. A firing temperature of less than 1700° C. may result in the formation of AlN as a subphase in the ceramic base. The firing temperature is preferably 1700° C. or more in terms of high corrosion resistance. In the case of using a lower sintered body and an upper sintered body formed at a temperature of 1700° C. or more, these sintered bodies can be bonded together at a temperature of 1650° C. or more. The upper limit of the firing temperature may be, but is not limited to, 1850° C. The firing is preferably hot-press firing. The pressing pressure in the hot-press firing preferably ranges from 50 to 300 kgf/cm$^2$. The firing atmosphere preferably does not affect the firing of oxide raw materials and is preferably an inert atmosphere, such as a nitrogen atmosphere, an Ar atmosphere, or a He atmosphere. The forming pressure may be any pressure at which the ceramic member can maintain its shape.

A ceramic member according to the present invention can be manufactured through these manufacturing processes. Examples of a member for a semiconductor manufacturing apparatus containing a ceramic member according to the present invention include electrostatic chucks, susceptors, and heaters for use in semiconductor manufacturing apparatuses. These members require high corrosion resistance to plasma of a corrosive gas containing a halogen element. Thus, a ceramic member according to the present invention is suitable for these members.

The ceramic members according to the embodiments described above include a ceramic base containing a solid solution Mg(Al)O(N) in which Al and N are dissolved in magnesium oxide as the main phase and therefore have substantially the same corrosion resistance as magnesium oxide and higher moisture resistance and water resistance than magnesium oxide and are chemically more stable than magnesium oxide. The electrode can have low reactivity to the ceramic base, and the difference in thermal expansion coefficient between the electrode and the ceramic base can be reduced. The ceramic members can ensure the electrical conductivity of the electrode and more effectively suppress cracking in the vicinity of the electrode.

The present invention is not limited to the embodiments described above and can be implemented in various aspects within the scope of the present invention.

For example, the member 20 for a semiconductor manufacturing apparatus in the embodiments described above may be the ceramic member 30 including the ceramic base 32 and the electrode 34. The ceramic member 30 can include a suitable electrode and can be chemically more stable.

Although the ceramic member 30 is used in semiconductor manufacturing apparatuses in the embodiments described above, the ceramic member 30 can be used in applications other than the semiconductor manufacturing apparatuses, such as ceramic heaters.

EXAMPLES

Preferred applications of the present invention will be described below. Experimental Examples 1 to 27 describe the results of the more specific study on ceramic bases. In Experimental Examples 1 to 16 and 23 to 27, at least 99.9 mass % pure commercial products having an average particle size of 1 μm or less were used as a MgO raw material and an Al$_2$O$_3$ raw material, and a 99 mass % pure commercial product having an average particle size of 1 μm or less was used as an AlN raw material. In Experimental Examples 17 to 22, a 99.4 mass % pure commercial product having an average particle size of 3 μm was used as a MgO raw material, a 99.9 mass % pure commercial product having an average particle size of 0.5 μm was used as an Al$_2$O$_3$ raw material, and the commercial product having an average particle size of 1 μm or less used in Experimental Examples 1 to 16 and 23 to 27 was used as an AlN raw material. Experimental Examples 1 to 4, 7 to 17, 21, and 23 to 27 corresponded to examples of the present invention. Experimental Examples 5 to 6, 18 to 20, and 22 corresponded to comparative examples.

Experimental Examples 1 to 16 and 25

Compounding

The MgO raw material, the Al$_2$O$_3$ raw material, and the AlN raw material were weighed at the mass percentages listed in Table 1 and were wet-blended in an isopropyl alcohol solvent in a nylon pot using alumina rounded stones having a diameter of 5 mm for four hours. After blending, the resulting slurry was removed and was dried in a nitrogen stream at 110° C. The dried product was passed through a 30-mesh sieve to yield a mixed powder. The mixed powder had a Mg/Al molar ratio of 2.9.

Molding

The mixed powder was uniaxially pressed at a pressure of 200 kgf/cm$^2$ to form a disc-shaped compact having a diameter of 50 mm and a thickness of approximately 20 mm. The disc-shaped compact was placed in a graphite mold for firing.

Firing

The disc-shaped compact was subjected to hot-press firing to manufacture a ceramic base. The hot-press firing was performed at a pressing pressure of 200 kgf/cm$^2$ at a firing temperature (maximum temperature) listed in Table 1 in an Ar atmosphere to the completion of firing. The holding time at the firing temperature was four hours.

Experimental Examples 17 to 21, 23, 24, 26, and 27

The MgO raw material, the Al$_2$O$_3$ raw material, and the AlN raw material were weighed at the mass percentages listed in Table 1. A ceramic base was formed in the same manner as in Experimental Example 1 except that the molding pressure of the mixed powder was 100 kgf/cm$^2$, the firing atmosphere was N$_2$, and the firing temperature (maximum temperature) listed in Table 1 was used.

Experimental Example 22

A mixed powder was prepared in a compounding process in the same manner as in Experimental Example 1 except that the MgO raw material and the Al$_2$O$_3$ raw material were weighed at the mass percentages listed in Table 1. The mixed powder was uniaxially pressed at a pressure of 100 kgf/cm$^2$ to form a cylindrical compact having a diameter of 20 mm and a thickness of approximately 15 mm. The compact was subjected to a CIP forming process at 3000 kgf/cm$^2$. A graphite crucible having a lid was charged with the mixed raw materials. The compact was then buried in the mixed raw materials. The cylindrical compact was fired at normal pressure in a firing process to manufacture a ceramic base. In the firing process, the cylindrical compact was fired at the firing temperature (maximum temperature) listed in Table 1 in an Ar atmosphere to the completion of firing. The holding time at the firing temperature was four hours.

[Evaluation]

The materials prepared in Experimental Examples 1 to 27 were processed for various evaluations and were subjected to the following evaluations. Tables 1 and 2 show the results.

(1) Bulk Density and Open Porosity

Measurement was performed in accordance with Archimedes' principle using pure water as a medium.

(2) Evaluation of Crystal Phase

A material was ground in a mortar, and a crystal phase in the material was identified with an X-ray diffractometer. The measurement conditions included CuKα, 40 kV, 40 mA, and 2θ=5 to 70 degrees. A sealed-tube X-ray diffractometer (D8 Advance manufactured by Bruker AXS K.K.) was used. The step width was 0.02 degrees. In order to measure the diffraction angle at a peak top, 10 mass % NIST Si standard sample powder (SRM 640C) was added to the material as an internal standard to correct the peak position. The diffraction angles of magnesium oxide at the peak tops were obtained from ICDD 78-0430. The peak-to-peak distances between Mg(Al)O(N) and magnesium oxide and the integral widths were calculated as described below.

(2)-1 Calculation of Peak-to-Peak Distance (Peak Shift)

For a relative comparison of the amounts of Al and N dissolved in Mg(Al)O(N), the peak-to-peak distance (peak shift) was measured on the (220) plane of the Mg(Al)O(N). The peak-to-peak distance was defined by the difference between a diffraction angle of the (220) plane of the Mg(Al)O(N) at its peak top and the diffraction angle (62.3 degrees) of the (220) plane of magnesium oxide listed in ICDD 78-0430.

(2)-2 Calculation of Integral Width

For a relative comparison of the crystallinity of Mg(Al)O(N), the integral width was calculated. The integral width was calculated by dividing the peak area of the (200) peak of the MgO—AlN solid solution by the peak top intensity ($I_{max}$) thereof. The peak area was calculated by integrating the intensities compensated for the background in the range of (the diffraction angle at the peak top−1 degree) to (the diffraction angle at the peak top+1 degree). The equation is described below. The background was defined by the intensity at a diffraction angle of (the diffraction angle at the peak top−1 degree). The integral width of the (111) plane of the NIST Si standard sample (SRM 640C) calculated as described above was 0.15 degrees.

Integral width=$(\Sigma I(2\theta) \times (\text{step width}))/I_{max}$ (2)-3 Calculation of XRD Peak Intensity Ratio Between Mg—Al Oxynitride Phase and Mg(al)O(N)

For a relative comparison of the amount of Mg—Al oxynitride phase contained as a subphase, the XRD peak intensity ratio between the Mg—Al oxynitride phase and Mg(Al)O(N) was calculated using the following method. The ratio A/B of the XRD peak intensity A of the Mg—Al oxynitride phase at 2θ=47 to 49 degrees to the XRD peak intensity B of the (220) plane of the Mg(Al)O(N) at 2θ=62.3 to 65.2 degrees was determined. The XRD peak intensity A was the integrated intensity of an XRD peak at 2θ=47 to 49 degrees compensated for the background. The XRD peak intensity B was the integrated intensity of an XRD peak of the (220) plane of the Mg(Al)O(N) compensated for the background. The calculation was performed with commercial software JADE5 available from MDI.

(3) Etch Rate

A material was mirror-polished and was subjected to a corrosion resistance test in an ICP plasma corrosion resistance test apparatus under the following conditions. The etch rate of each material was calculated by dividing a difference in level between a mask surface and an exposed surface measured with a profiler by the test time.

ICP: 800 W, bias: 450 W, introduced gas: $NF_3/O_2/Ar=75/35/100$ scan 0.05 Torr, exposure time: 10 h, sample temperature: room temperature (4) Constituent Element The detection, identification, and concentration analysis of the constituent elements were performed with EPMA.

(5) Moisture Resistance

A material was ground in a mortar to prepare a powder having a median size of 10 μm or less. The powder was exposed to a saturated water vapor pressure atmosphere at room temperature for four days. After that, the amount of dehydration was measured with a TG-DTA apparatus from 40° C. to 500° C.

(6) Moisture Resistance of Bulk Material

A material was mirror-polished and was exposed to an atmosphere at 40° C. at a relative humidity of 90% for 28 days. After that, the surface of the sample was observed with a scanning electron microscope (XL30 manufactured by Royal Philips Electronics). A sample showing no change in the surface state was rated good (○). A sample having acicular or granular deposits on 40% or more of its surface was rated poor (x). A sample having an intermediate rating was indicated by (Δ).

(7) Water Resistance of Bulk Material

A material was mirror-polished and was immersed in water at room temperature for 15 days. After that, the surface of the sample was observed with a scanning electron microscope. A sample showing no change in the surface state was rated good (○). A sample showing traces of elution on 40% or more of its surface was rated poor (x). A sample having an intermediate rating was indicated by (Δ).

(8) Fracture Toughness

The fracture toughness was evaluated using a SEPB method according to JIS-R1607.

(9) Bending Strength

Measurement was perform in a bending strength test according to JIS-R1601.

(10) Measurement of Volume Resistivity

Measurement was perform in the air at room temperature using a method according to JIS-C2141. The dimensions of a test specimen were 50 mm in diameter×(0.5 to 1 mm). The main electrode had a diameter of 20 mm. A guard electrode had an inner diameter of 30 mm and an outer diameter of 40 mm. An application electrode had a diameter of 40 mm. These electrodes were made of silver. The applied voltage was 2 kV/mm. The electric current was measured one minute after the voltage application. The volume resistivity at room temperature was calculated from the electric current. In the same manner, measurement was performed in Experimental Examples 1, 3, 5, and 12 in a vacuum (0.01 Pa or less) at 600° C. The dimensions of a test specimen were 50 mm in diameter×(0.5 to 1 mm). The main electrode had a diameter of 20 mm. A guard electrode had an inner diameter of 30 mm and an outer diameter of 40 mm. An application electrode had a diameter of 40 mm. These electrodes were made of silver. The applied voltage was 500 V/mm. The electric current was measured one hour after the voltage application. The volume resistivity was calculated from the electric current. The term "aEb" in the volume resistivity in Table 2 means "$a \times 10^b$". For example, "1E16" means $1 \times 10^{16}$.

TABLE 1

| Composition | MgO mass % | $Al_2O_3$ mass % | AlN mass % | Mg/Al molar ratio | Firing temperature ° C. | Firing atmosphere | Bulk density g/cm³ | Open porosity % | Crystal phase Main phase[1] |
|---|---|---|---|---|---|---|---|---|---|
| Experimental example1 | 70.7 | 22.0 | 7.2 | 2.9 | 1850 | Ar | 3.53 | 0.15 | Mg(Al)O(N) |
| Experimental example2 | 70.7 | 22.0 | 7.2 | 2.9 | 1800 | Ar | 3.54 | 0.04 | Mg(Al)O(N) |
| Experimental example3 | 70.7 | 22.0 | 7.2 | 2.9 | 1750 | Ar | 3.54 | 0.04 | Mg(Al)O(N) |
| Experimental example4 | 70.7 | 22.0 | 7.2 | 2.9 | 1650 | Ar | 3.53 | 0.10 | Mg(Al)O(N) |
| Experimental example5 | 100 | — | — | — | 1500 | Ar | 3.57 | 0.30 | MgO |
| Experimental example6 | 37.0 | 63.0 | — | 0.7 | 1650 | Ar | 3.57 | 0.00 | $MgAl_2O_4$ |
| Experimental example7 | 60.7 | 29.6 | 9.7 | 1.9 | 1850 | Ar | 3.52 | 0.05 | Mg(Al)O(N) |
| Experimental example8 | 60.7 | 29.6 | 9.7 | 1.9 | 1800 | Ar | 3.52 | 0.05 | Mg(Al)O(N) |
| Experimental example9 | 60.7 | 29.6 | 9.7 | 1.9 | 1750 | Ar | 3.52 | 0.05 | Mg(Al)O(N) |

TABLE 1-continued

| | | | | | | | | | |
|---|---|---|---|---|---|---|---|---|---|
| Experimental example10 | 61.2 | 25.2 | 13.5 | 1.9 | 1800 | Ar | 3.49 | 0.02 | Mg(Al)O(N) |
| Experimental example11 | 66.2 | 24.1 | 9.7 | 2.3 | 1800 | Ar | 3.52 | 0.01 | Mg(Al)O(N) |
| Experimental example12 | 71.2 | 18.8 | 10.1 | 2.9 | 1800 | Ar | 3.52 | 0.03 | Mg(Al)O(N) |
| Experimental example13 | 56.1 | 28.6 | 15.3 | 1.5 | 1800 | Ar | 3.47 | 0.05 | Mg(Al)O(N) |
| Experimental example14 | 85.0 | 11.3 | 3.7 | 10.6 | 1800 | Ar | 3.55 | 0.07 | Mg(Al)O(N) |
| Experimental example15 | 72.6 | 9.3 | 18.2 | 2.9 | 1800 | Ar | 3.46 | 0.00 | Mg(Al)O(N) |
| Experimental example16 | 74.0 | 24.7 | 1.3 | 3.6 | 1800 | Ar | 3.56 | 0.19 | Mg(Al)O(N) |
| Experimental example17 | 49.0 | 28.2 | 22.8 | 1.1 | 1775 | $N_2$ | 3.41 | 0.00 | MgO—AlNss |
| Experimental example18 | 70.7 | 22.0 | 7.2 | 2.9 | 1600 | $N_2$ | 3.53 | 0.05 | MgO |
| Experimental example19 | 60.7 | 29.6 | 9.7 | 1.9 | 1600 | $N_2$ | 3.54 | 0.07 | MgO |
| Experimental example20 | 41.0 | 38.4 | 20.6 | 0.8 | 1800 | $N_2$ | 3.43 | 0.04 | $MgAl_2O_4$, Mg—Al—O—N, MgO—AlNss |
| Experimental example21 | 60.7 | 29.6 | 9.7 | 1.9 | 1725 | $N_2$ | 3.52 | 0.06 | MgO—AlNss |
| Experimental example22 | 61.1 | 38.9 | — | 2.0 | 1850 | Ar | — | — | MgO |
| Experimental example23 | 60.7 | 29.6 | 9.7 | 1.9 | 1900 | $N_2$ | 3.52 | 0.05 | Mg(Al)O(N) |
| Experimental example24 | 60.7 | 29.6 | 9.7 | 1.9 | 1775 | $N_2$ | 3.52 | 0.05 | Mg(Al)O(N) |
| Experimental example25 | 60.7 | 29.6 | 9.7 | 1.9 | 1775 | Ar | 3.52 | 0.05 | Mg(Al)O(N) |
| Experimental example26 | 60.7 | 29.6 | 9.7 | 1.9 | 1700 | $N_2$ | 3.52 | 0.06 | Mg(Al)O(N) |
| Experimental example27 | 60.7 | 29.6 | 9.7 | 1.9 | 1650 | $N_2$ | 3.53 | 0.09 | Mg(Al)O(N) |

| | Crystal | Peak top of MgO—AlNss | | | Peak shift of (220) | Integral width of (200) |
|---|---|---|---|---|---|---|
| Composition | phase Subphase[2) | (111)plane (°) | (200)plane (°) | (220)plane (°) | plane[3) (°) | plane[4) (°) |
| Experimental example1 | $MgAl_2O_4$, Mg—Al—O—N | 37.22 | 43.26 | 62.85 | 0.55 | 0.26 |
| Experimental example2 | $MgAl_2O_4$, Mg—Al—O—N | 37.14 | 43.18 | 62.73 | 0.43 | 0.25 |
| Experimental example3 | $MgAl_2O_4$, Mg—Al—O—N | 36.96 | 43.16 | 62.75 | 0.45 | 0.45 |
| Experimental example4 | $MgAl_2O_4$, AlN | 36.94 | 42.92 | 62.33 | 0.03 | 0.34 |
| Experimental example5 | — | 36.90 | 42.90 | 62.30 | 0.00 | 0.28 |
| Experimental example6 | MgO | — | 42.90 | 62.30 | 0.00 | 0.27 |
| Experimental example7 | $MgAl_2O_4$, Mg—Al—O—N | — | 43.18 | 62.73 | 0.43 | 0.26 |
| Experimental example8 | $MgAl_2O_4$, Mg—Al—O—N | — | 43.18 | 62.73 | 0.43 | 0.32 |
| Experimental example9 | $MgAl_2O_4$, Mg—Al—O—N | — | 43.04 | 62.65 | 0.35 | 0.49 |
| Experimental example10 | $MgAl_2O_4$, Mg—Al—O—N | — | 43.20 | 62.75 | 0.45 | 0.31 |
| Experimental example11 | $MgAl_2O_4$, Mg—Al—O—N | — | 43.20 | 62.75 | 0.45 | 0.28 |
| Experimental example12 | Mg—Al—O—N | 37.24 | 43.26 | 62.83 | 0.53 | 0.30 |
| Experimental example13 | $MgAl_2O_4$, Mg—Al—O—N | — | 43.18 | 62.73 | 0.43 | 0.30 |
| Experimental example14 | $MgAl_2O_4$, Mg—Al—O—N | 37.06 | 43.08 | 62.53 | 0.23 | 0.25 |
| Experimental example15 | Mg—Al—O—N | 36.98 | 42.98 | 62.41 | 0.11 | 0.27 |
| Experimental example16 | $MgAl_2O_4$ | — | 42.94 | 62.37 | 0.07 | 0.25 |
| Experimental example17 | $MgAl_2O_4$, Mg—Al—O—N | — | 43.18 | 62.72 | 0.42 | 0.35 |

TABLE 1-continued

| | | | | | | |
|---|---|---|---|---|---|---|
| Experimental example18 | MgAl₂O₄, AlN | 36.9 | 42.90 | 62.30 | 0.00 | 0.31 |
| Experimental example19 | MgAl₂O₄, AlN | — | 42.90 | 62.30 | 0.00 | 0.30 |
| Experimental example20 | MgAl₂O₄, Mg—Al—O—N, MgO—AlNss | — | 43.17 | 62.72 | 0.42 | 0.27 |
| Experimental example21 | MgAl₂O₄, Mg—Al—O—N | — | 43.02 | 62.63 | 0.33 | 0.51 |
| Experimental example22 | MgAl₂O₄ | — | 42.90 | 62.30 | 0.00 | 0.24 |
| Experimental example23 | MgAl₂O₄, Mg—Al—O—N | — | 43.18 | 62.73 | 0.43 | 0.26 |
| Experimental example24 | MgAl₂O₄, Mg—Al—O—N | — | 43.17 | 62.72 | 0.41 | 0.30 |
| Experimental example25 | MgAl₂O₄, Mg—Al—O—N | — | 43.17 | 62.72 | 0.41 | 0.30 |
| Experimental example26 | MgAl₂O₄, Mg—Al—O—N | — | 43.10 | 62.69 | 0.39 | 0.53 |
| Experimental example27 | MgAl₂O₄, AlN | — | 42.92 | 62.33 | 0.06 | 0.34 |

[1] Mg(Al)O(N): MgO—AlN solid solution (cubic crystal)
[2] Mg—Al—O—N: Mg—Al oxynitride
[3] XRD peak-to-peak distance between Mg(Al)O(N)(220)plane and MgO(220) plane
[4] Integral width of (200)plane of Mg(Al)O(N)

TABLE 2

| Composition | XRD peak A/B[1] | Etch rate (nm/h) | Water loss rate (%) | Moisture resistance of bulk material[2] | Water resistance of bulk material[3] | Fracture toughness MPa·m^{1/2} | Strength (MPa) | Volume resistivity (Ω·cm) | Volume resistivity 600°C. (Ω·cm) |
|---|---|---|---|---|---|---|---|---|---|
| Experimental example1 | 0.004 | 109 | 1.8 | ○ | ○ | — | 65 | — | 8E9 |
| Experimental example2 | 0.004 | 112 | 1.9 | ○ | ○ | 2.2 | 145 | >1E17 | — |
| Experimental example3 | 0.003 | 110 | 1.9 | ○ | Δ | 2 | 171 | >1E17 | 3E10 |
| Experimental example4 | 0.000 | 168 | 2.2 | Δ | x | — | 275 | — | — |
| Experimental example5 | 0.000 | 104 | 6.5 | x | x | 2.2 | 240 | >1E17 | 2E12 |
| Experimental example6 | 0.000 | 202 | 2.7 | x | x | — | — | — | — |
| Experimental example7 | 0.058 | 142 | 1.6 | ○ | ○ | 2.6 | 204 | — | — |
| Experimental example8 | 0.039 | 146 | 1.7 | ○ | ○ | 2.5 | 222 | >1E17 | — |
| Experimental example9 | 0.052 | 147 | 1.9 | ○ | Δ | 2.5 | 243 | — | — |
| Experimental example10 | 0.074 | 138 | 1.8 | ○ | ○ | 2.7 | 204 | >1E17 | — |
| Experimental example11 | 0.031 | 143 | 1.8 | ○ | ○ | 2.5 | 183 | — | — |
| Experimental example12 | 0.023 | 93 | 1.4 | ○ | ○ | 1.9 | 152 | — | 2E10 |
| Experimental example13 | 0.138 | 166 | 1.9 | ○ | ○ | 3.1 | 251 | — | — |
| Experimental example14 | 0.005 | 105 | 2.2 | ○ | Δ | 2.1 | 177 | — | — |
| Experimental example15 | 0.125 | 124 | 2.3 | Δ | Δ | 4.4 | 350 | >1E17 | — |
| Experimental example16 | 0.000 | 104 | 2.3 | Δ | x | 2.2 | 185 | — | — |
| Experimental example17 | 0.321 | 181 | 1.8 | ○ | ○ | 3.2 | 270 | — | — |
| Experimental example18 | 0.000 | 171 | 3.6 | x | x | — | — | — | — |
| Experimental example19 | 0.000 | 175 | 3.4 | x | x | — | — | — | — |
| Experimental example20 | 0.449 | 201 | 1.9 | ○ | ○ | 3.3 | 275 | — | — |
| Experimental example21 | 0.058 | 154 | 1.9 | ○ | x | 2.6 | 249 | — | — |
| Experimental example22 | 0.000 | — | 3.2 | x | x | — | — | — | — |

TABLE 2-continued

| Composition | XRD peak A/B[1] | Etch rate (nm/h) | Water loss rate (%) | Moisture resistance of bulk material[2] | Water resistance of bulk material[3] | Fracture toughness MPa·m$^{1/2}$ | Strength (MPa) | Volume resistivity (Ω·cm) | Volume resistivity 600° C. (Ω·cm) |
|---|---|---|---|---|---|---|---|---|---|
| Experimental example23 | 0.063 | 135 | 1.6 | ○ | ○ | 1.3 | 121 | — | — |
| Experimental example24 | 0.046 | 141 | 1.7 | ○ | ○ | 2.5 | 231 | >1E17 | — |
| Experimental example25 | 0.047 | 138 | 1.7 | ○ | ○ | 2.5 | 236 | >1E17 | — |
| Experimental example26 | 0.051 | 150 | 1.9 | ○ | x | 2.5 | 222 | — | — |
| Experimental example27 | 0.032 | 195 | 2.9 | Δ | x | — | — | — | — |

[1]A: Peak intensity of Mg—Al—O—N at 2θ = 47 to 49 degrees, B: Peak intensity of MgO at 2θ = 62.3 to 65.2 degrees
[2]Changes of microstructure was observed before and after exposing mirror-polished samples to water-vapor atmosphere at 40° C. at 90 RH % for 28 days.
A sample showing no change is ○, a sample having deposits on 40% or more of its surface is (x), a sample having intermediate rating is (Δ).
[3]Changes of microstructure was observed before and after immersing mirror-polished sample in water by RT and exposing for 15 days.
A sample showing no change is ○, a sample showing traces of elution on 40% or more of its surface is (x), a sample having intermediate rating is (Δ).
4) "—" indicates that measurement was not carried out.

[Evaluation Results]

Figure 2:
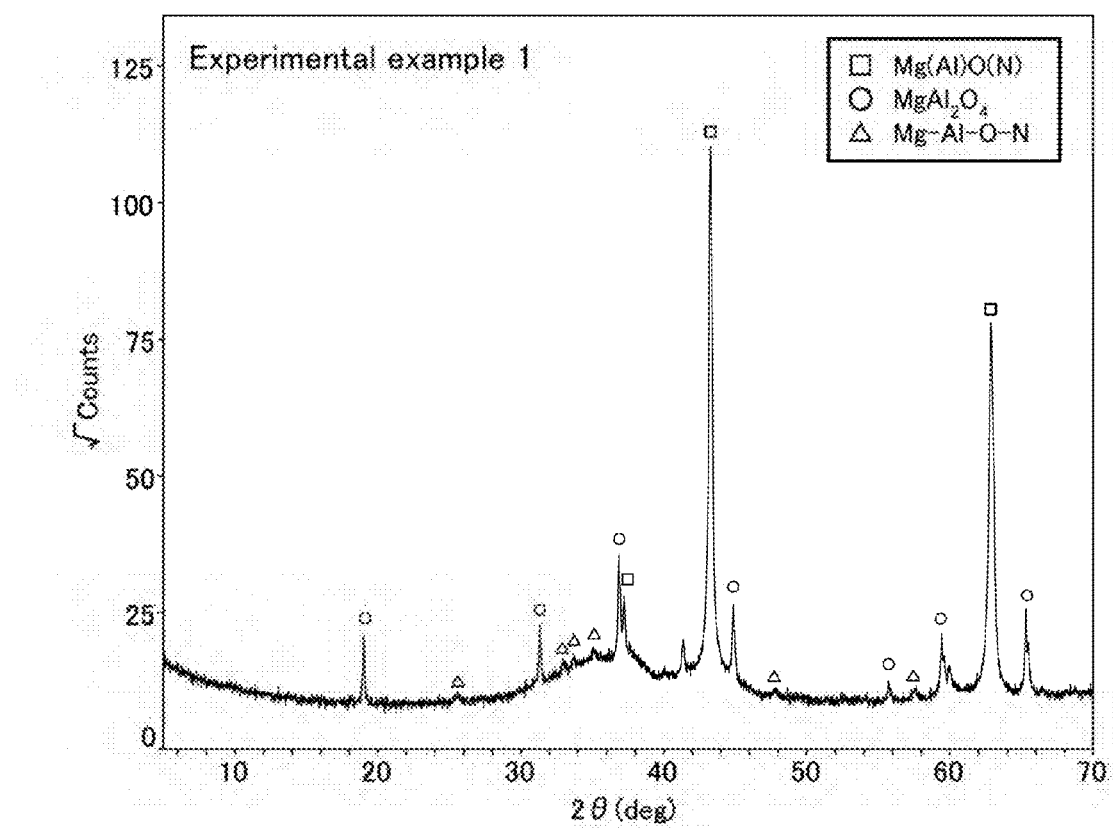
FIG. 2 is an XRD analysis chart of Experimental Example 1.
Figure 3:
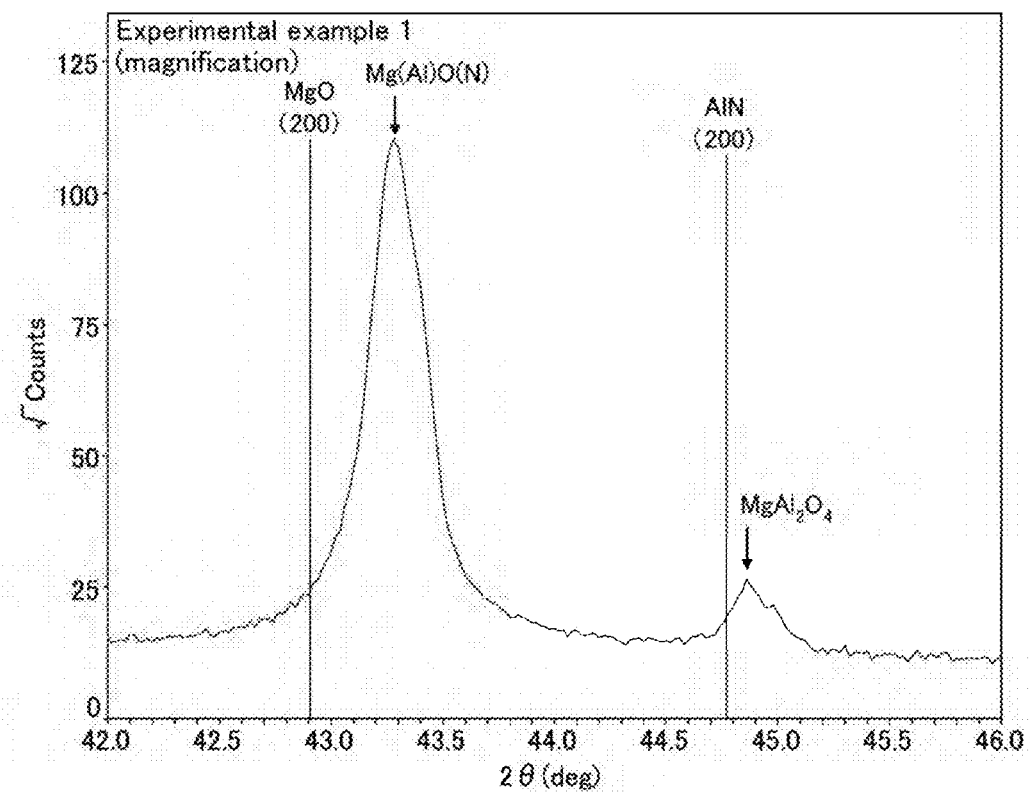
FIG. 3 is an enlarged view of a Mg(Al)O(N) peak in the XRD analysis chart of Experimental Example 1.
Figure 4:
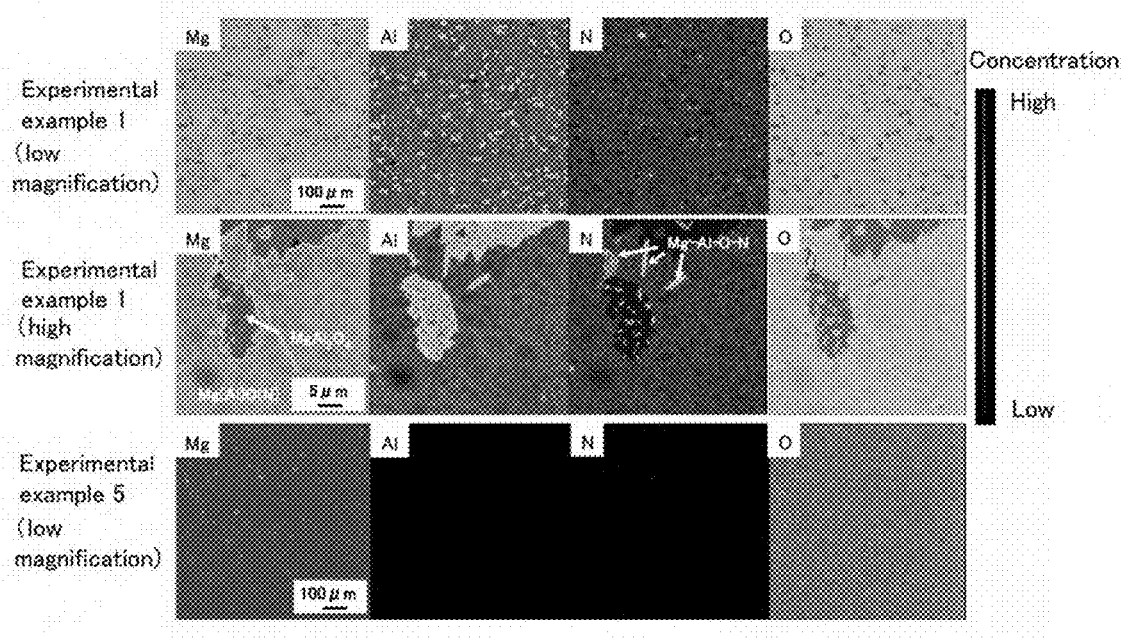
FIG. 4 is EPMA element mapping images of Experimental Examples 1 and 5.

The crystal phase evaluation in Tables 1 and 2 shows that the ceramic bases of Experimental Examples 1 to 3, 7 to 17, 21, and 23 to 27 contained, as the main phase, Mg(Al)O(N) having XRD peaks of the (111), (200), and (220) planes at 2θ=36.9 to 39, 42.9 to 44.8, and 62.3 to 65.2 degrees, respectively, between a magnesium oxide cubic crystal peak and an aluminum nitride cubic crystal peak and contained Mg—Al oxynitride (Mg—Al—O—N) and spinel (MgAl$_2$O$_4$) having XRD peaks at least at 2θ=47 to 49 degrees as subphases. However, the ceramic bases did not contain AlN. As representative examples, FIG. 2 shows the XRD analysis chart of Experimental Example 1, FIG. 3 shows the enlarged view of an XRD peak of Mg(Al)O(N) in Experimental Example 1, and Table 1 lists the peak tops of the (111), (200), and (220) planes of Mg(Al)O(N) in Experimental Examples 1 to 22, the distance (peak shift) between the XRD peak top of the (220) plane of Mg(Al)O(N) and the peak top of magnesium oxide, and the integral width of the XRD peak of the (200) plane of Mg(Al)O(N). In Experimental Examples 6 to 11, 13, 16, 17, and 19 to 27, the peak top of the (111) plane could not be discriminated because of the overlap between the spinel peak and the peak of the (111) plane of Mg(Al)O(N). Thus, these peak tops of the (111) plane were not listed in Table 1. A greater peak shift indicates larger amounts of Al and N dissolved in the solid solution. A smaller integral width indicates more uniform solid solution. The XRD analysis charts of Experimental Example 2, 3, 7 to 17, 20, and 21 to 27 were omitted because they were variations on Experimental Example 1 with respect to the Mg(Al)O(N), Mg—Al oxynitride, and spinel contents. The term "main phase", as used herein, refers to a component constituting 50% by volume or more of the material. The term "subphase", as used herein, refers to a phase having identified XRD peaks other than the main phase. Since the area ratio in cross-sectional observation reflects the volume percentage, the main phase is a region occupying 50% by area or more in an EPMA element mapping image, and the subphase is a region other than the main phase. Although Experimental Example 20 contained three components of Mg(Al)O(N), Mg—Al oxynitride, and spinel as in Experimental Example 1, the amounts of these components were substantially the same, and the components constituted a composite material without the main phase. Thus, the three components were described in both the main phase and the subphase in Table 1. FIG. 4 shows EPMA element mapping images of Experimental Example 1. FIG. 4 shows that the main phase portion of Experimental Example 1 was mainly composed of Mg and O, and Al and N were also detected. Thus, the main phase portion was Mg(Al)O(N) as shown in FIGS. 2 and 3. A spinel portion and a small amount of Mg—Al oxynitride portion were observed as subphases. FIG. 4 shows that the area ratio of Mg(Al)O(N) in Experimental Example 1 was approximately 86%, indicating that the Mg(Al)O(N) was the main phase. The other experimental examples were also analyzed in the same manner. For example, the area ratios of Mg(Al)O(N) in Experimental Examples 7 and 15 were approximately 59% and approximately 75%, respectively, indicating that the Mg(Al)O(N) was the main phase. Although the main phase and the subphase(s) were determined using EPMA element mapping, the main phase and the subphase(s) may be determined using another method that can determine the volume percentages of these phases.

The EPMA element mapping images were classified by red, orange, yellow, yellow-green, green, blue, and indigo depending on the concentration. Red represents the highest concentration. Indigo represents the lowest concentration. Black represents zero. Since FIG. 4 is a monochrome image, the original colors of FIG. 4 will be described below. In Experimental Example 1 (low magnification), Mg had an orange background and blue points, Al had a blue background and orange points, N had a blue background and indigo points, and O had an orange background and red points. In Experimental Example 1 (high magnification), Mg had an orange background (Mg(Al)O(N)), a blue island (MgAl$_2$O$_4$), and a green linear portion (Mg—Al—O—N: magnesium aluminum oxynitride), Al had a blue background, an orange island, and an orange linear portion, N had a blue background, an indigo island, and a green linear portion, and O had an orange background, a red island, and a green linear portion. In Experimental Example 5 (low magnification), Mg and O were red, and Al and N were black.

The crystal phase evaluation shows that the ceramic base of Experimental Example 4 contained Mg(Al)O(N) as the main phase and spinel and AlN as subphases. Table 1 lists the distance (peak shift) between the XRD peak of the Mg(Al)O(N) of Experimental Example 4 and the XRD peak of magnesium oxide. A firing temperature of 1650° C. as in Experimental Example 4 probably results in a low reaction rate and low amounts of Al and N dissolved in the solid solution. Since the reaction is unlikely to occur at a firing temperature of 1600° C., no Mg(Al)O(N) was formed in the ceramic bases of Experimental Examples 18 and 19.

The ceramic base of Experimental Example 5 contained MgO as the main phase. The ceramic base of Experimental Example 6 contained spinel as the main phase and MgO as a subphase. The ceramic base of Experimental Example 22 contained MgO as the main phase and spinel as a subphase. Thus, it was found that when the raw materials contained no AlN component, the Al component did not dissolve in MgO through hot pressing or firing at normal pressure.

Figure 5:
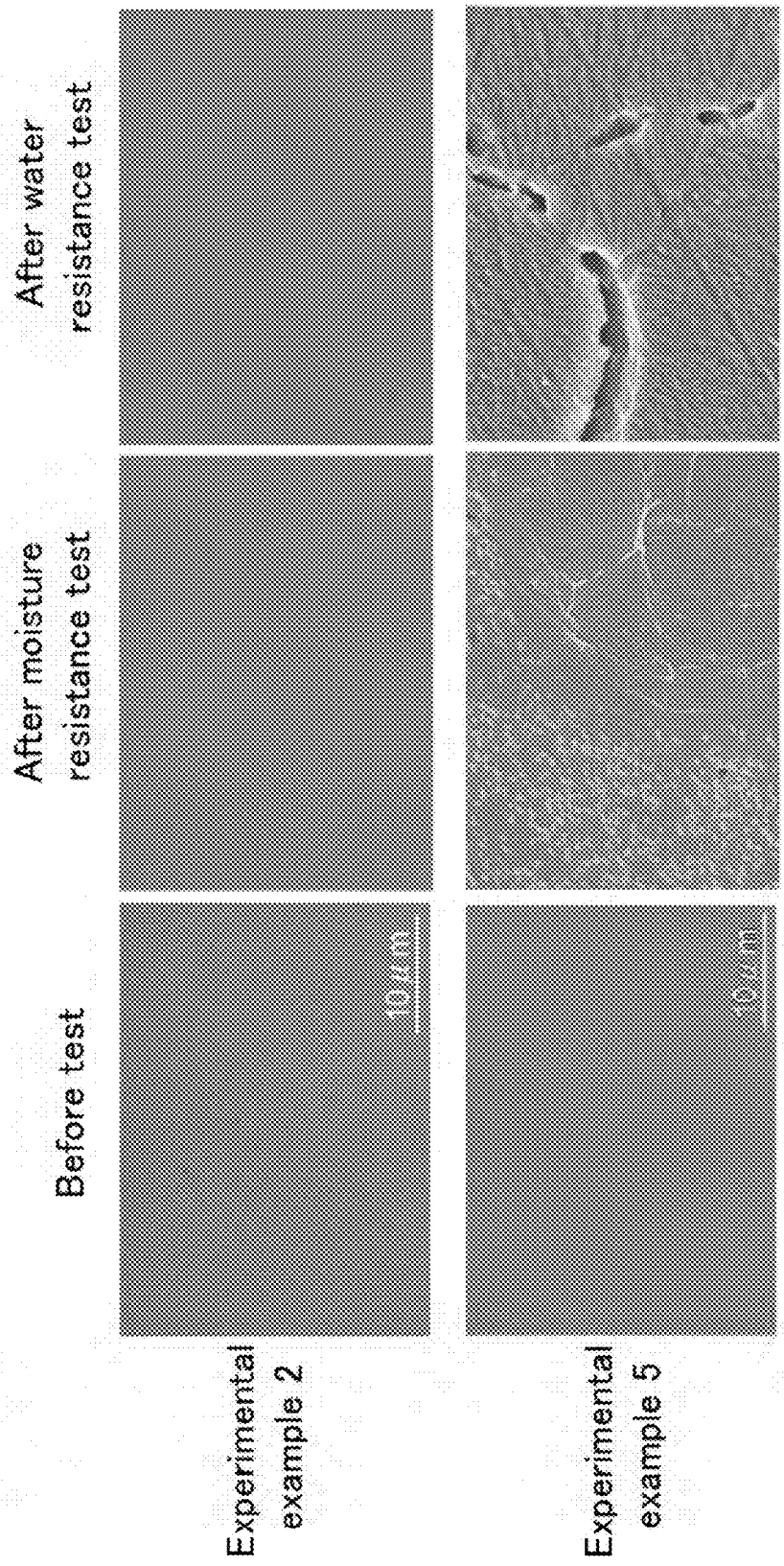
FIG. 5 is microstructure photographs in moisture resistance and water resistance tests of bulk materials according to Experimental Examples 2 and 5.
Figure 6:
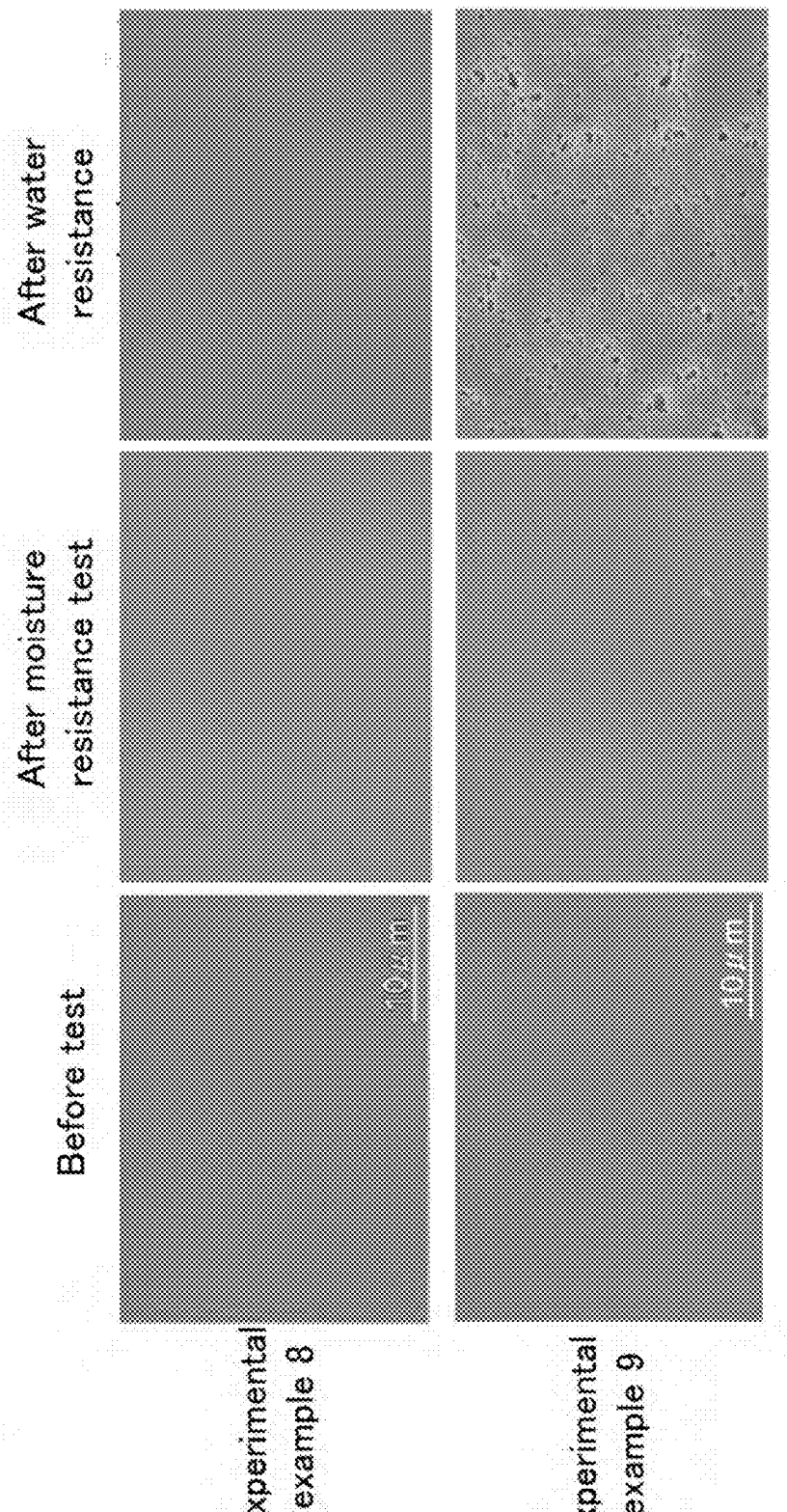
FIG. 6 is microstructure photographs in moisture resistance and water resistance tests of bulk materials according to Experimental Examples 8 and 9.

The water loss rates (mass loss rates measured with TG-DTA from 40° C. to 500° C.) of the ceramic bases of Experimental Examples 1 to 3, 7 to 13, 17, 20, 21, and 23 to 26 were 2% or less. The water loss rates of the ceramic bases of Experimental Examples 4, 6, 14 to 16, and 27 were 3% or less. Thus, these ceramic bases had much higher moisture resistance than the MgO ceramic, that is, the ceramic base of Experimental Example 5. As representative examples of moisture resistance and water resistance tests of bulk materials, FIG. 5 shows microstructure photographs of Experimental Examples 2 and 5, and FIG. 6 shows microstructure photographs of Experimental Examples 8 and 9. The moisture resistance of bulk materials increased with increasing amounts of Al and N dissolved in the solid solution. The surface states of Experimental Examples 1 to 3, 7 to 14, 17, 20, 21, and 27, in which the peak shift of the (220) plane of Mg(Al)O(N) from magnesium oxide was 0.2 degrees or more, were unchanged and good through the moisture resistance test of bulk materials (exposure to a 40° C. and 90RH % atmosphere for 28 days). Although the surface states of Experimental Examples 4, 15, 16, and 27 changed through the moisture resistance test of bulk materials, these changes in the surface states were smaller than the changes in the surface states of Experimental Example 5, 6, 18, 19, and 22, which had acicular and granular deposits on 40% or more of the surface thereof. This result shows that the moisture resistance of bulk materials depends on the amount of Al and N components dissolved in MgO. A bulk material in which the peak shift of the (220) plane of Mg(Al)O(N) from magnesium oxide was less than 0.03 degrees showed a change in its surface state on 40% or more of the surface thereof and had low moisture resistance. A bulk material in which the peak shift was 0.03 degrees or more and less than 0.2 degrees had high moisture resistance. A bulk material in which the peak shift was 0.2 degrees or more had very high moisture resistance. More specifically, a bulk material having the XRD peak of the (220) plane of Mg(Al)O(N) at 62.33 degrees or more and less than 62.50 degrees (2θ) between a magnesium oxide cubic crystal peak and an aluminum nitride cubic crystal peak had high moisture resistance, and a bulk material having the XRD peak of the (220) plane of Mg(Al)O(N) at 62.50 degrees or more had very high moisture resistance. A bulk material having the XRD peak of the (200) plane of Mg(Al)O(N) at 42.92 degrees or more and less than 43.04 degrees between a magnesium oxide cubic crystal peak and an aluminum nitride cubic crystal peak had high moisture resistance, and a bulk material having the XRD peak of the (220) plane of Mg(Al)O(N) at 43.04 degrees or more had very high moisture resistance.

It was also found that the water resistance of bulk materials increased with increasing peak shift and decreasing integral width. Experimental Examples 1, 2, 7, 8, 10 to 13, 17, and 20, in which the XRD peak shift of the (220) plane was 0.42 degrees or more and the integral width was 0.35 degrees or less, showed no change in the surface state through the water resistance test of bulk materials. Experimental Examples 3, 9, 14, and 15 had a small number of openings due to elution in the water resistance test of bulk materials. Experimental Examples 4 to 6, 16, 18, 19, 22, and 27 as well as Experimental Examples 21 and 26, in which the integral width was more than 0.50 degrees, had elution on 40% or more of the surface thereof. These results showed that the water resistance of bulk materials increased with increasing amount of Al and N components dissolved in MgO and increasing homogeneity. A material in which the peak shift of the (220) plane of Mg(Al)O(N) from magnesium oxide was 0.05 degrees or less had elution on 40% or more of the surface thereof and low water resistance. A material in which the peak shift was 0.05 degrees or more and less than 0.42 degrees or materials in which the peak shift was 0.42 degrees or more but the integral width of the (200) plane of Mg(Al)O(N) was more than 0.35 degrees had high water resistance. A material in which the peak shift was 0.42 degrees or more and the integral width was 0.35 degrees or less had very high water resistance. More specifically, a material which had the XRD peak of the (220) plane of Mg(Al)O(N) at 62.35 degrees or more and less than 62.72 degrees (2θ) between a magnesium oxide cubic crystal peak and an aluminum nitride cubic crystal peak or a material in which the XRD peak of the (220) plane appeared at 62.72 degrees or more but the integral width of the (200) plane was more than 0.35 degrees had high water resistance. A material in which the XRD peak of the (220) plane appeared at 62.72 degrees or more and the integral width was 0.35 degrees or less had very high water resistance. A material having the XRD peak of the (200) plane of Mg(Al)O(N) at 42.95 degrees or more and less than 43.17 degrees between a magnesium oxide cubic crystal peak and an aluminum nitride cubic crystal peak had high water resistance, and a material having 2θ=43.17 degrees or more had very high water resistance.

The etch rates shown in Table 2 showed that the ceramic bases of Experimental Examples 1 to 3, 12, and 14 to 16 had high corrosion resistance comparable to the corrosion resistance of the MgO ceramic of Experimental Example 5. The etch rates showed that the ceramic bases of Experimental Examples 4, 7 to 11, 13, 21, and 23 to 26 had slightly lower corrosion resistance than MgO of Experimental Example 5 but higher corrosion resistance than the ceramic base of Experimental Example 6, which contained spinel as the main phase, or yttria (having an etch rate of approximately 240 nm/h) (not shown). The mechanical characteristics of Experimental Examples 1 to 3, 7 to 15, and 23 to 26, which contained a Mg—Al oxynitride (Mg—Al—O—N) phase as a subphase, increased with increasing Mg—Al oxynitride phase content. Table 2 lists the ratio A/B of the XRD peak intensity A of the Mg—Al oxynitride phase at 2θ=47 to 49 degrees to the XRD peak intensity B of the (220) plane of Mg(Al)O(N) at 2θ=62.3 to 65.2 degrees. A higher A/B ratio indicates a higher Mg—Al oxynitride content. The fracture toughness and the bending strength increased with increasing A/B ratio. Experimental Examples 7 to 11, 13, 15, 17, 20, 21, and 24 to 26 having A/B of 0.03 or more had a fracture toughness of 2.5 or more and a high bending strength of 180 MPa or more. Experimental Examples 7 to 10, 13, 15, 17, 20, and 21 had a high bending strength of 200 MPa or more. For example, Experimental Example 8 had A of 4317 counts and B of 83731 counts, an A/B ratio of 0.039, a fracture toughness of 2.5, and a strength of 222 MPa. Experimental Example 15 had A of 13566 counts, B of 108508 counts, an A/B ratio of 0.125, a fracture toughness of 4.4, and a strength of 350 MPa. With an increase in the amount of Mg—Al oxynitride, however, the corrosion-resistant Mg(Al)O(N) content decreased, and accordingly the corrosion resistance decreased. For example, Experimental Example 17 having A/B of 0.3 or more had an etch rate as high as 181 nm/h. Experimental Example 20 having A/B of more than 0.4 had substantially the same corrosion resistance as spinel. These results showed that both corrosion resistance and mechanical strength were satisfactory at an A/B ratio of 0.03 or more and 0.14 or less.

Experimental Examples 2, 3, 8, 10, 15, 24, and 25 had a volume resistivity of $1 \times 10^{17}$ Ωcm or more at room temperature, which was similar to the volume resistivity of MgO of Experimental Example 5, and were therefore suitable for semiconductor manufacturing apparatuses, such as electrostatic chucks and heaters, that require high resistance.

Experimental Examples 5 and 12 had a volume resistivity of $2 \times 10^{12}$ and $2 \times 10^{10}$ Ωcm, respectively, at 600° C. Thus, the ceramic base of Experimental Example 12 had a lower electrical resistance than MgO (Experimental Example 5). Like Experimental Example 12, the ceramic bases of Experimental Examples 1 and 3 had a lower electrical resistance than Experimental Example 5.

The manufacture of a ceramic member including a ceramic base and an electrode (a buried electrode body) will be described in the following examples. In Examples 1 to 112 and Comparative Examples 1 to 22, a 99.4 mass % pure commercial product having an average particle size of 3 μm was used as a MgO raw material, a 99.9 mass % pure commercial product having an average particle size of 0.5 μm was used as an $Al_2O_3$ raw material, and a 99 mass % pure commercial product having an average particle size of 1 μm or less was used as an AlN raw material.

A buried electrode body was manufactured by forming a sintered body, applying an electrode paste to the sintered body, placing a compact or a sintered body on the electrode, and sintering the layered body.

[Manufacture of Ceramic Member]

A first sintered body was formed. In a compounding process, the MgO raw material, the $Al_2O_3$ raw material, and the AlN raw material were weighed at the mass percentages listed in Tables 3 to 8 and were wet-blended in an isopropyl alcohol solvent in a nylon pot using iron-core nylon balls having a diameter of 20 mm for four hours. After blending, the resulting slurry was removed and was dried in a nitrogen stream at 110° C. The dried product was passed through a 30-mesh sieve to yield a mixed powder. In a subsequent first molding process, the mixed powder was uniaxially pressed at a pressure of 100 kgf/cm² to form a disc-shaped compact having a diameter of 50 mm and a thickness of approximately 20 mm. The disc-shaped compact was placed in a graphite mold for firing. In a subsequent first firing process, the disc-shaped compact was subjected to hot-press firing to form a first sintered body. The hot-press firing was performed at a pressing pressure of 200 kgf/cm² at a first firing temperature (maximum temperature) listed in Tables 3 to 8 in a nitrogen or Ar atmosphere to the completion of firing. The holding time at the firing temperature was four hours. In a subsequent processing process, the first sintered body was processed into a disk having a diameter of approximately 50 mm and a thickness of 3.5 mm. A surface of the first sintered body was subjected to #800 finishing and was used as a printing surface for an electrode paste.

In a subsequent electrode formation process, an electrode paste was applied to the surface of the first sintered body to form an electrode pattern. An electrode component serving as an electrode raw material was a commercial product of NbN, TiN, ZrN, WC, TaC, ZrC, TiC, NbC, $Mo_2C$, Mo, W, Nb, Cr, Ru, Ir, Pt, Rh, $TiB_2$, $ZrB_2$, $MoSi_2$, or $WSi_2$. A filler component serving as an electrode raw material was MgO (99.4 mass % pure, average particle size 3 μm) or Mg(Al)O(N). Mg(Al)O(N) was the sintered body used in the ceramic base and was ground to an average particle size of approximately 1 μm. The electrode paste was prepared by mixing and kneading the electrode raw materials, an organic solvent, and a binder listed in Tables 3 to 8. The binder/organic solvent was a mixture of poly(vinyl butyral)/diethylene glycol monobutyl ether. The electrode paste was applied to the sintered body by screen printing to form an electrode having a width of 5 mm and a length of 15 mm. The electrode had a thickness in the range of 50 to 100 μm. After printing, the electrode paste was dried in the air.

The ceramic base and the electrode were then cofired. First, in a second molding process, the mixed powder of the raw materials of the first sintered body was uniaxially pressed at a pressure of 100 kgf/cm² to form a disc-shaped second compact having a diameter of 50 mm and a thickness of approximately 20 mm. The second compact was placed on a surface of the first sintered body on which the electrode pattern was formed. Thus, a three-layer body composed of the first sintered body/electrode pattern/second compact was formed. Alternatively, a second sintered body formed in the same manner as the first sintered body was placed on a surface of the first sintered body on which the electrode pattern was formed. Thus, a three-layer body composed of the first sintered body/electrode pattern/second sintered body was formed. The layered body was then placed in a carbon firing jig for hot pressing and was subjected to hot-press firing in a second firing process. The second firing process was performed at a pressing pressure of 200 kgf/cm² at a second firing temperature (maximum temperature) listed in Tables 3 to 8 in a nitrogen or Ar atmosphere to the completion of firing. The holding time at the firing temperature was four hours. Thus, the compact and the electrode pattern were sintered and formed a second sintered body and an electrode, and the first sintered body, the electrode, and the second sintered body were bonded together to form an integrated ceramic member including the electrode. A small piece was cut out from the integrated ceramic member and was used in an evaluation test described below. A ceramic member (a component including a buried electrode) may also be manufactured by using a compact as a first portion instead of the first sintered body, forming an electrode pattern on a surface of the compact, placing a second compact on the compact, and hot-press firing the layered body.

Examples 1 to 112

Buried electrode bodies according to Examples 1 to 112 were manufactured under conditions listed in Tables 3 to 7. In Examples 22 to 24, 32 to 34, 41 to 43, 50 to 52, 61 to 63, 78 to 80, 91 to 93, and 110 to 112, the first sintered body and the second sintered body were used in combination to manufacture a buried electrode body. The second sintered body was the same as the first sintered body. In the other examples, the first sintered body and the second compact were used in combination to manufacture a buried electrode body.

Comparative Examples 1 to 22

Buried electrode bodies according to Comparative Examples 1 to 22 were manufactured under conditions listed in Tables 3 and 8. In Comparative Examples 9, 10, 13, 14, 17, 18, 21, and 22, the first sintered body and the second sintered body were used in combination to manufacture a buried electrode body. The second sintered body was the same as the first sintered body. In the other comparative examples, the first sintered body and the second compact were used in combination to manufacture a component including a buried electrode. Tables 3 to 8 show the amounts of ceramic base raw materials, firing temperature, firing atmosphere, the amounts of electrode raw materials, and thermal expansion coefficient in Examples 1 to 112 and Comparative Examples 1 to 22.

TABLE 3

| | First firing process | | | | Second firing process Raw material of electrode | | | |
|---|---|---|---|---|---|---|---|---|
| | Raw material of first compact | | | First firing condition | | Electrode component | | |
| | MgO (mass %) | $Al_2O_3$ (mass %) | AlN (mass %) | First firing temperature (°C.) | Firing atmosphere | Kind | Thermal expansion coefficient (ppm/K) | Amount (% by volume) | Filler component Kind |
| Example 1 | 85.0 | 11.3 | 3.7 | 1800 | $N_2$ | NbN | 10.1 | 40 | MgO |
| Example 2 | 60.7 | 29.6 | 9.7 | 1800 | $N_2$ | NbN | 10.1 | 45 | Mg(Al)O(N)*[1] |
| Example 3 | 49.0 | 28.2 | 22.8 | 1775 | Ar | NbN | 10.1 | 100 | — |
| Example 4 | 60.7 | 29.6 | 9.7 | 1800 | $N_2$ | TiN | 9.0 | 60 | MgO |
| Example 5 | 60.7 | 29.6 | 9.7 | 1800 | $N_2$ | ZrN | 7.7 | 50 | MgO |
| Example 6 | 49.0 | 28.2 | 22.8 | 1775 | $N_2$ | WC | 4.7 | 45 | MgO |
| Example 7 | 60.7 | 29.6 | 9.7 | 1800 | $N_2$ | TaC | 6.4 | 40 | MgO |
| Example 8 | 49.0 | 28.2 | 22.8 | 1775 | $N_2$ | ZrC | 6.7 | 55 | MgO |
| Example 9 | 60.7 | 29.6 | 9.7 | 1800 | $N_2$ | TiC | 7.5 | 50 | MgO |
| Example 10 | 49.0 | 28.2 | 22.8 | 1775 | $N_2$ | NbC | 6.7 | 55 | MgO |
| Example 11 | 49.0 | 28.2 | 22.8 | 1775 | $N_2$ | $Mo_2C$ | 5.8 | 50 | MgO |
| Example 12 | 49.0 | 28.2 | 22.8 | 1775 | $N_2$ | Mo | 5.7 | 50 | MgO |
| Example 13 | 49.0 | 28.2 | 22.8 | 1775 | $N_2$ | W | 4.9 | 45 | MgO |
| Example 14 | 60.7 | 29.6 | 9.7 | 1800 | $N_2$ | Nb | 8.1 | 55 | MgO |
| Example 15 | 85.0 | 11.3 | 3.7 | 1800 | $N_2$ | Cr | 12.8 | 90 | Mg(Al)O(N)*[1] |
| Comparative example 1 | 49.0 | 28.2 | 22.8 | 1775 | $N_2$ | $TiB_2$ | 7.4 | 60 | MgO |
| Comparative example 2 | 49.0 | 28.2 | 22.8 | 1775 | $N_2$ | $ZrB_2$ | 6.8 | 55 | MgO |
| Comparative example 3 | 60.7 | 29.6 | 9.7 | 1800 | Ar | $MoSi_2$ | 8.5 | 60 | MgO |
| Comparative example 4 | 60.7 | 29.6 | 9.7 | 1800 | $N_2$ | $WSi_2$ | 8.0 | 50 | MgO |
| Comparative example 5 | 49.0 | 28.2 | 22.8 | 1775 | $N_2$ | WC | 4.7 | 50 | MgO |
| Comparative example 6 | 85.0 | 11.3 | 3.7 | 1775 | $N_2$ | Mo | 5.7 | 15 | MgO |

| | Second firing process | | | | | | | |
|---|---|---|---|---|---|---|---|---|
| | Raw material of electrode | | | | | | | |
| | Filler component | | Average thermal expansion coefficient of electrode*[2] D (ppm/K) | Raw material of second compact | | | Second firing condition | |
| | Thermal expansion coefficient (ppm/K) | Amount (% by volume) | | MgO (mass %) | $Al_2O_3$ (mass %) | AlN (mass %) | Second firing temperature (°C.) | Firing atmosphere |
| Example 1 | 13.9 | 60 | 12.4 | 85.0 | 11.3 | 3.7 | 1775 | $N_2$ |
| Example 2 | 11.1 | 55 | 10.7 | 60.7 | 29.6 | 9.7 | 1775 | $N_2$ |
| Example 3 | — | — | 10.1 | 49.0 | 28.2 | 22.8 | 1750 | Ar |
| Example 4 | 13.9 | 40 | 11.0 | 60.7 | 29.6 | 9.7 | 1775 | $N_2$ |
| Example 5 | 13.9 | 50 | 10.8 | 61.2 | 25.2 | 13.5 | 1750 | $N_2$ |
| Example 6 | 13.9 | 55 | 9.8 | 49.0 | 28.2 | 22.8 | 1750 | $N_2$ |
| Example 7 | 13.9 | 60 | 10.9 | 61.2 | 25.2 | 13.5 | 1750 | $N_2$ |
| Example 8 | 13.9 | 45 | 9.9 | 49.0 | 28.2 | 22.8 | 1775 | $N_2$ |
| Example 9 | 13.9 | 50 | 10.7 | 60.7 | 29.6 | 9.7 | 1800 | $N_2$ |
| Example 10 | 13.9 | 45 | 9.9 | 49.0 | 28.2 | 22.8 | 1750 | $N_2$ |
| Example 11 | 13.9 | 50 | 9.9 | 49.0 | 28.2 | 22.8 | 1750 | $N_2$ |
| Example 12 | 13.9 | 50 | 9.8 | 49.0 | 28.2 | 22.8 | 1750 | $N_2$ |
| Example 13 | 13.9 | 55 | 9.9 | 49.0 | 28.2 | 22.8 | 1775 | $N_2$ |
| Example 14 | 13.9 | 45 | 10.7 | 60.7 | 29.6 | 9.7 | 1750 | $N_2$ |
| Example 15 | 12.8 | 10 | 12.8 | 85.0 | 11.3 | 3.7 | 1775 | $N_2$ |

TABLE 3-continued

| | | | | | | | | |
|---|---|---|---|---|---|---|---|---|
| Comparative example 1 | 13.9 | 40 | 10.0 | 49.0 | 28.2 | 22.8 | 1750 | $N_2$ |
| Comparative example 2 | 13.9 | 45 | 10.0 | 49.0 | 28.2 | 22.8 | 1750 | $N_2$ |
| Comparative example 3 | 13.9 | 40 | 10.7 | 60.7 | 29.6 | 9.7 | 1775 | Ar |
| Comparative example 4 | 13.9 | 50 | 11.0 | 60.7 | 29.6 | 9.7 | 1775 | $N_2$ |
| Comparative example 5 | 13.9 | 50 | 9.3 | 49.0 | 28.2 | 22.8 | 1750 | $N_2$ |
| Comparative example 6 | 13.9 | 85 | 12.7 | 85.0 | 11.3 | 3.7 | 1750 | $N_2$ |

*[1] Respectively, ground products of first sintered bodies in Example 2, 15.
*[2] average thermal expansion coefficient of electrode component and filler component

TABLE 4

| | First firing process | | | | | Second firing process Raw material of electrode | | | | |
|---|---|---|---|---|---|---|---|---|---|---|
| | Raw material of first compact | | | First firing condition | | Electrode component | | | Filler component | |
| | | | | First firing | | | Thermal expansion | Amount | Thermal expansion | Amount |
| | MgO (mass %) | $Al_2O_3$ (mass %) | AlN (mass %) | temperature (° C.) | Firing atmosphere | Kind | coefficient (ppm/K) | (% by volume) | Kind coefficient (ppm/K) | (% by volume) |
| Example 16 | 60.7 | 29.6 | 9.7 | 1775 | $N_2$ | NbN | 10.1 | 75 | MgO 13.9 | 25 |
| Example 17 | 60.7 | 29.6 | 9.7 | 1775 | $N_2$ | NbN | 10.1 | 55 | MgO 13.9 | 45 |
| Example 18 | 60.7 | 29.6 | 9.7 | 1775 | $N_2$ | NbN | 10.1 | 95 | MgO 13.9 | 5 |
| Example 19 | 60.7 | 29.6 | 9.7 | 1775 | Ar | NbN | 10.1 | 95 | MgO 13.9 | 5 |
| Example 20 | 60.7 | 29.6 | 9.7 | 1700 | $N_2$ | NbN | 10.1 | 95 | MgO 13.9 | 5 |
| Example 21 | 60.7 | 29.6 | 9.7 | 1850 | $N_2$ | NbN | 10.1 | 95 | MgO 13.9 | 5 |
| Example 22 | 60.7 | 29.6 | 9.7 | 1775 | $N_2$ | NbN | 10.1 | 95 | MgO 13.9 | 5 |
| Example 23 | 60.7 | 29.6 | 9.7 | 1775 | $N_2$ | NbN | 10.1 | 95 | MgO 13.9 | 5 |
| Example 24 | 60.7 | 29.6 | 9.7 | 1775 | $N_2$ | NbN | 10.1 | 95 | MgO 13.9 | 5 |
| Example 25 | 85.0 | 11.3 | 3.7 | 1775 | $N_2$ | TiN | 9.0 | 38 | MgO 13.9 | 62 |
| Example 26 | 49.0 | 28.2 | 22.8 | 1775 | $N_2$ | TiN | 9.0 | 75 | MgO 13.9 | 25 |
| Example 27 | 60.7 | 29.6 | 9.7 | 1775 | $N_2$ | TiN | 9.0 | 40 | MgO 13.9 | 60 |
| Example 28 | 60.7 | 29.6 | 9.7 | 1775 | $N_2$ | TiN | 9.0 | 73 | MgO 13.9 | 27 |
| Example 29 | 60.7 | 29.6 | 9.7 | 1775 | Ar | TiN | 9.0 | 73 | MgO 13.9 | 27 |
| Example 30 | 60.7 | 29.6 | 9.7 | 1700 | $N_2$ | TiN | 9.0 | 73 | MgO 13.9 | 27 |
| Example 31 | 60.7 | 29.6 | 9.7 | 1850 | $N_2$ | TiN | 9.0 | 73 | MgO 13.9 | 27 |
| Example 32 | 60.7 | 29.6 | 9.7 | 1775 | $N_2$ | TiN | 9.0 | 73 | MgO 13.9 | 27 |
| Example 33 | 60.7 | 29.6 | 9.7 | 1775 | $N_2$ | TiN | 9.0 | 73 | MgO 13.9 | 27 |
| Example 34 | 60.7 | 29.6 | 9.7 | 1775 | $N_2$ | TiN | 9.0 | 73 | MgO 13.9 | 27 |
| Example 35 | 60.7 | 29.6 | 9.7 | 1775 | $N_2$ | Mo | 5.7 | 44 | MgO 13.9 | 56 |
| Example 36 | 60.7 | 29.6 | 9.7 | 1775 | $N_2$ | Mo | 5.7 | 35 | MgO 13.9 | 65 |
| Example 37 | 60.7 | 29.6 | 9.7 | 1775 | $N_2$ | Mo | 5.7 | 58 | MgO 13.9 | 42 |
| Example 38 | 60.7 | 29.6 | 9.7 | 1775 | Ar | Mo | 5.7 | 44 | MgO 13.9 | 56 |
| Example 39 | 60.7 | 29.6 | 9.7 | 1700 | $N_2$ | Mo | 5.7 | 44 | MgO 13.9 | 56 |
| Example 40 | 60.7 | 29.6 | 9.7 | 1850 | $N_2$ | Mo | 5.7 | 44 | MgO 13.9 | 56 |
| Example 41 | 60.7 | 29.6 | 9.7 | 1775 | $N_2$ | Mo | 5.7 | 44 | MgO 13.9 | 56 |
| Example 42 | 60.7 | 29.6 | 9.7 | 1775 | $N_2$ | Mo | 5.7 | 44 | MgO 13.9 | 56 |
| Example 43 | 60.7 | 29.6 | 9.7 | 1775 | $N_2$ | Mo | 5.7 | 44 | MgO 13.9 | 56 |

| | Second firing process | | | | | |
|---|---|---|---|---|---|---|
| | Raw material of electrode Average thermal expansion coefficient of electrode* D (ppm/K) | Raw material of second compact | | | Second firing condition | |
| | | MgO (mass %) | $Al_2O_3$ (mass %) | AlN (mass %) | Second firing temperature (° C.) | Firing atmosphere |
| Example 16 | 11.1 | 60.7 | 29.6 | 9.7 | 1775 | $N_2$ |
| Example 17 | 11.8 | 60.7 | 29.6 | 9.7 | 1775 | $N_2$ |
| Example 18 | 10.3 | 60.7 | 29.6 | 9.7 | 1775 | $N_2$ |
| Example 19 | 10.3 | 60.7 | 29.6 | 9.7 | 1775 | Ar |
| Example 20 | 10.3 | 60.7 | 29.6 | 9.7 | 1700 | $N_2$ |

TABLE 4-continued

| | | | | | | |
|---|---|---|---|---|---|---|
| Example 21 | 10.3 | 60.7 | 29.6 | 9.7 | 1850 | $N_2$ |
| Example 22 | 10.3 | Using second sintered body | | | 1650 | $N_2$ |
| Example 23 | 10.3 | Using second sintered body | | | 1775 | $N_2$ |
| Example 24 | 10.3 | Using second sintered body | | | 1850 | $N_2$ |
| Example 25 | 12.0 | 85.0 | 11.3 | 3.7 | 1775 | $N_2$ |
| Example 26 | 10.2 | 49.0 | 28.2 | 22.8 | 1775 | $N_2$ |
| Example 27 | 11.9 | 60.7 | 29.6 | 9.7 | 1775 | $N_2$ |
| Example 28 | 10.3 | 60.7 | 29.6 | 9.7 | 1775 | $N_2$ |
| Example 29 | 10.3 | 60.7 | 29.6 | 9.7 | 1775 | Ar |
| Example 30 | 10.3 | 60.7 | 29.6 | 9.7 | 1700 | $N_2$ |
| Example 31 | 10.3 | 60.7 | 29.6 | 9.7 | 1850 | $N_2$ |
| Example 32 | 10.3 | Using second sintered body | | | 1650 | $N_2$ |
| Example 33 | 10.3 | Using second sintered body | | | 1775 | $N_2$ |
| Example 34 | 10.3 | Using second sintered body | | | 1850 | $N_2$ |
| Example 35 | 10.3 | 60.7 | 29.6 | 9.7 | 1775 | $N_2$ |
| Example 36 | 11.0 | 60.7 | 29.6 | 9.7 | 1775 | $N_2$ |
| Example 37 | 9.1 | 60.7 | 29.6 | 9.7 | 1775 | $N_2$ |
| Example 38 | 10.3 | 60.7 | 29.6 | 9.7 | 1775 | Ar |
| Example 39 | 10.3 | 60.7 | 29.6 | 9.7 | 1700 | $N_2$ |
| Example 40 | 10.3 | 60.7 | 29.6 | 9.7 | 1850 | $N_2$ |
| Example 41 | 10.3 | Using second sintered body | | | 1650 | $N_2$ |
| Example 42 | 10.3 | Using second sintered body | | | 1775 | $N_2$ |
| Example 43 | 10.3 | Using second sintered body | | | 1850 | $N_2$ |

*average thermal expansion coefficient of electrode component and filler component

TABLE 5

| | First firing process | | | | | Second firing process Raw material of electrode | | | | |
|---|---|---|---|---|---|---|---|---|---|---|
| | Raw material of first compact | | | First firing condition | | Electrode component | | | Filler component | |
| | | | | First firing | | | Thermal expansion | Amount | Thermal expansion | Amount |
| | MgO (mass %) | $Al_2O_3$ (mass %) | AlN (mass %) | temperature (° C.) | Firing atmosphere | Kind | coefficient (ppm/K) | (% by volume) | Kind coefficient (ppm/K) | (% by volume) |
| Example 44 | 60.7 | 29.6 | 9.7 | 1775 | $N_2$ | W | 4.9 | 40 | MgO 13.9 | 60 |
| Example 45 | 60.7 | 29.6 | 9.7 | 1775 | $N_2$ | W | 4.9 | 35 | MgO 13.9 | 65 |
| Example 46 | 60.7 | 29.6 | 9.7 | 1775 | $N_2$ | W | 4.9 | 53 | MgO 13.9 | 47 |
| Example 47 | 60.7 | 29.6 | 9.7 | 1775 | Ar | W | 4.9 | 40 | MgO 13.9 | 60 |
| Example 48 | 60.7 | 29.6 | 9.7 | 1700 | $N_2$ | W | 4.9 | 40 | MgO 13.9 | 60 |
| Example 49 | 60.7 | 29.6 | 9.7 | 1850 | $N_2$ | W | 4.9 | 40 | MgO 13.9 | 60 |
| Example 50 | 60.7 | 29.6 | 9.7 | 1775 | $N_2$ | W | 4.9 | 40 | MgO 13.9 | 60 |
| Example 51 | 60.7 | 29.6 | 9.7 | 1775 | $N_2$ | W | 4.9 | 40 | MgO 13.9 | 60 |
| Example 52 | 60.7 | 29.6 | 9.7 | 1775 | $N_2$ | W | 4.9 | 40 | MgO 13.9 | 60 |
| Example 53 | 60.7 | 29.6 | 9.7 | 1775 | $N_2$ | Nb | 8.1 | 50 | MgO 13.9 | 50 |
| Example 54 | 49.0 | 28.2 | 22.8 | 1775 | $N_2$ | Nb | 8.1 | 65 | MgO 13.9 | 35 |
| Example 55 | 60.7 | 29.6 | 9.7 | 1775 | $N_2$ | Nb | 8.1 | 35 | MgO 13.9 | 65 |
| Example 56 | 60.7 | 29.6 | 9.7 | 1775 | $N_2$ | Nb | 8.1 | 62 | MgO 13.9 | 38 |
| Example 57 | 60.7 | 29.6 | 9.7 | 1775 | $N_2$ | Nb | 8.1 | 83 | MgO 13.9 | 17 |
| Example 58 | 60.7 | 29.6 | 9.7 | 1775 | Ar | Nb | 8.1 | 62 | MgO 13.9 | 38 |
| Example 59 | 60.7 | 29.6 | 9.7 | 1775 | $N_2$ | Nb | 8.1 | 62 | MgO 13.9 | 38 |
| Example 60 | 60.7 | 29.6 | 9.7 | 1775 | $N_2$ | Nb | 8.1 | 62 | MgO 13.9 | 38 |
| Example 61 | 60.7 | 29.6 | 9.7 | 1775 | $N_2$ | Nb | 8.1 | 62 | MgO 13.9 | 38 |
| Example 62 | 60.7 | 29.6 | 9.7 | 1775 | $N_2$ | Nb | 8.1 | 62 | MgO 13.9 | 38 |
| Example 63 | 60.7 | 29.6 | 9.7 | 1775 | $N_2$ | Nb | 8.1 | 62 | MgO 13.9 | 38 |
| Example 64 | 60.7 | 29.6 | 9.7 | 1775 | $N_2$ | V | 11.1 | 100 | MgO 13.9 | 0 |
| Example 65 | 60.7 | 29.6 | 9.7 | 1775 | $N_2$ | Ti | 10.4 | 100 | MgO 13.9 | 0 |
| Example 66 | 60.7 | 29.6 | 9.7 | 1775 | $N_2$ | Zr | 6.4 | 48 | MgO 13.9 | 52 |
| Example 67 | 60.7 | 29.6 | 9.7 | 1775 | $N_2$ | Hf | 7.1 | 53 | MgO 13.9 | 47 |
| Example 68 | 85.0 | 11.3 | 3.7 | 1775 | $N_2$ | Ru | 8.4 | 34 | MgO 13.9 | 66 |
| Example 69 | 60.7 | 29.6 | 9.7 | 1775 | $N_2$ | Ru | 8.4 | 50 | MgO 13.9 | 50 |
| Example 70 | 49.0 | 28.2 | 22.8 | 1775 | $N_2$ | Ru | 8.4 | 65 | MgO 13.9 | 35 |
| Example 71 | 60.7 | 29.6 | 9.7 | 1775 | $N_2$ | Ru | 8.4 | 35 | MgO 13.9 | 65 |
| Example 72 | 60.7 | 29.6 | 9.7 | 1775 | $N_2$ | Ru | 8.4 | 65 | MgO 13.9 | 35 |

TABLE 5-continued

| | | Second firing process | | | | | |
|---|---|---|---|---|---|---|---|
| | | Raw material of electrode Average thermal expansion coefficient of electrode* D (ppm/K) | Raw material of second compact | | | Second firing condition | |
| | | | MgO (mass %) | Al₂O₃ (mass %) | AlN (mass %) | Second firing temperature (° C.) | Firing atmosphere |
| | Example 44 | 10.3 | 60.7 | 29.6 | 9.7 | 1775 | N₂ |
| | Example 45 | 10.8 | 60.7 | 29.6 | 9.7 | 1775 | N₂ |
| | Example 46 | 9.1 | 60.7 | 29.6 | 9.7 | 1775 | N₂ |
| | Example 47 | 10.3 | 60.7 | 29.6 | 9.7 | 1775 | Ar |
| | Example 48 | 10.3 | 60.7 | 29.6 | 9.7 | 1700 | N₂ |
| | Example 49 | 10.3 | 60.7 | 29.6 | 9.7 | 1850 | N₂ |
| | Example 50 | 10.3 | Using second sintered body | | | 1650 | N₂ |
| | Example 51 | 10.3 | Using second sintered body | | | 1775 | N₂ |
| | Example 52 | 10.3 | Using second sintered body | | | 1850 | N₂ |
| | Example 53 | 11.0 | 60.7 | 29.6 | 9.7 | 1775 | N₂ |
| | Example 54 | 10.1 | 49.0 | 28.2 | 22.8 | 1775 | N₂ |
| | Example 55 | 11.9 | 60.7 | 29.6 | 9.7 | 1775 | N₂ |
| | Example 56 | 10.3 | 60.7 | 29.6 | 9.7 | 1775 | N₂ |
| | Example 57 | 9.1 | 60.7 | 29.6 | 9.7 | 1775 | N₂ |
| | Example 58 | 10.3 | 60.7 | 29.6 | 9.7 | 1775 | Ar |
| | Example 59 | 10.3 | 60.7 | 29.6 | 9.7 | 1700 | N₂ |
| | Example 60 | 10.3 | 60.7 | 29.6 | 9.7 | 1850 | N₂ |
| | Example 61 | 10.3 | Using second sintered body | | | 1650 | N₂ |
| | Example 62 | 10.3 | Using second sintered body | | | 1775 | N₂ |
| | Example 63 | 10.3 | Using second sintered body | | | 1850 | N₂ |
| | Example 64 | 11.1 | 60.7 | 29.6 | 9.7 | 1775 | N₂ |
| | Example 65 | 10.4 | 60.7 | 29.6 | 9.7 | 1775 | N₂ |
| | Example 66 | 10.3 | 60.7 | 29.6 | 9.7 | 1775 | N₂ |
| | Example 67 | 10.3 | 60.7 | 29.6 | 9.7 | 1775 | N₂ |
| | Example 68 | 12.0 | 85.0 | 11.3 | 3.7 | 1775 | N₂ |
| | Example 69 | 11.2 | 60.7 | 29.6 | 9.7 | 1775 | N₂ |
| | Example 70 | 10.3 | 49.0 | 28.2 | 22.8 | 1775 | N₂ |
| | Example 71 | 12.0 | 60.7 | 29.6 | 9.7 | 1775 | N₂ |
| | Example 72 | 10.3 | 60.7 | 29.6 | 9.7 | 1775 | N₂ |

*average thermal expansion coefficient of electrode component and filler component

TABLE 6

| | First firing process | | | | | Second firing process Raw material of electrode | | | | | |
|---|---|---|---|---|---|---|---|---|---|---|---|
| | Raw material of first compact | | | First firing condition | | Electrode component | | | Filler component | | |
| | | | | First firing | | | Thermal expansion | Amount | | Thermal expansion | Amount |
| | MgO (mass %) | Al₂O₃ (mass %) | AlN (mass %) | temperature (° C.) | Firing atmosphere | Kind | coefficient (ppm/K) | (% by volume) | Kind | coefficient (ppm/K) | (% by volume) |
| Example 68 | 85.0 | 11.3 | 3.7 | 1775 | N₂ | Ru | 8.4 | 34 | MgO | 13.9 | 66 |
| Example 69 | 60.7 | 29.6 | 9.7 | 1775 | N₂ | Ru | 8.4 | 50 | MgO | 13.9 | 50 |
| Example 70 | 49.0 | 28.2 | 22.8 | 1775 | N₂ | Ru | 8.4 | 65 | MgO | 13.9 | 35 |
| Example 71 | 60.7 | 29.6 | 9.7 | 1775 | N₂ | Ru | 8.4 | 35 | MgO | 13.9 | 65 |
| Example 72 | 60.7 | 29.6 | 9.7 | 1775 | N₂ | Ru | 8.4 | 65 | MgO | 13.9 | 35 |
| Example 73 | 60.7 | 29.6 | 9.7 | 1775 | N₂ | Ru | 8.4 | 85 | MgO | 13.9 | 15 |
| Example 74 | 60.7 | 29.6 | 9.7 | 1775 | N₂ | Ru | 8.4 | 100 | MgO | 13.9 | 0 |
| Example 75 | 60.7 | 29.6 | 9.7 | 1775 | Ar | Ru | 8.4 | 65 | MgO | 13.9 | 35 |
| Example 76 | 60.7 | 29.6 | 9.7 | 1700 | N₂ | Ru | 8.4 | 65 | MgO | 13.9 | 35 |
| Example 77 | 60.7 | 29.6 | 9.7 | 1850 | N₂ | Ru | 8.4 | 65 | MgO | 13.9 | 35 |
| Example 78 | 60.7 | 29.6 | 9.7 | 1775 | N₂ | Ru | 8.4 | 65 | MgO | 13.9 | 35 |
| Example 79 | 60.7 | 29.6 | 9.7 | 1775 | N₂ | Ru | 8.4 | 65 | MgO | 13.9 | 35 |
| Example 80 | 60.7 | 29.6 | 9.7 | 1775 | N₂ | Ru | 8.4 | 65 | MgO | 13.9 | 35 |
| Example 81 | 85.0 | 11.3 | 3.7 | 1775 | N₂ | Ir | 8.8 | 35 | MgO | 13.9 | 65 |
| Example 82 | 60.7 | 29.6 | 9.7 | 1775 | N₂ | Ir | 8.8 | 55 | MgO | 13.9 | 45 |
| Example 83 | 49.0 | 28.2 | 22.8 | 1775 | N₂ | Ir | 8.8 | 75 | MgO | 13.9 | 25 |
| Example 84 | 60.7 | 29.6 | 9.7 | 1775 | N₂ | Ir | 8.8 | 40 | MgO | 13.9 | 60 |
| Example 85 | 60.7 | 29.6 | 9.7 | 1775 | N₂ | Ir | 8.8 | 70 | MgO | 13.9 | 30 |

TABLE 6-continued

| | | | | | | | | | | | | |
|---|---|---|---|---|---|---|---|---|---|---|---|---|
| Example 86 | 60.7 | 29.6 | 9.7 | 1775 | N₂ | Ir | 8.8 | 95 | MgO | 13.9 | 5 |
| Example 87 | 60.7 | 29.6 | 9.7 | 1775 | N₂ | Ir | 8.8 | 100 | MgO | 13.9 | 0 |
| Example 88 | 60.7 | 29.6 | 9.7 | 1775 | Ar | Ir | 8.8 | 70 | MgO | 13.9 | 30 |
| Example 89 | 60.7 | 29.6 | 9.7 | 1700 | N₂ | Ir | 8.8 | 70 | MgO | 13.9 | 30 |
| Example 90 | 60.7 | 29.6 | 9.7 | 1850 | N₂ | Ir | 8.8 | 70 | MgO | 13.9 | 30 |
| Example 91 | 60.7 | 29.6 | 9.7 | 1775 | N₂ | Ir | 8.8 | 70 | MgO | 13.9 | 30 |
| Example 92 | 60.7 | 29.6 | 9.7 | 1775 | N₂ | Ir | 8.8 | 70 | MgO | 13.9 | 30 |
| Example 93 | 60.7 | 29.6 | 9.7 | 1775 | N₂ | Ir | 8.8 | 70 | MgO | 13.9 | 30 |
| Example 94 | 60.7 | 29.6 | 9.7 | 1775 | N₂ | Pt | 10.5 | 100 | MgO | 13.9 | 0 |
| Example 95 | 60.7 | 29.6 | 9.7 | 1775 | N₂ | Rh | 11.0 | 100 | MgO | 13.9 | 0 |

| | Second firing process | | | | |
|---|---|---|---|---|---|
| | Raw material of electrode Average thermal expansion coefficient of electrode* D (ppm/K) | Raw material of second compact | | | Second firing condition |
| | | MgO (mass %) | Al₂O₃ (mass %) | AlN (mass %) | Second firing temperature (°C.) / Firing atmosphere |
| Example 68 | 12.0 | 85.0 | 11.3 | 3.7 | 1775 / N₂ |
| Example 69 | 11.2 | 60.7 | 29.6 | 9.7 | 1775 / N₂ |
| Example 70 | 10.3 | 49.0 | 28.2 | 22.8 | 1775 / N₂ |
| Example 71 | 12.0 | 60.7 | 29.6 | 9.7 | 1775 / N₂ |
| Example 72 | 10.3 | 60.7 | 29.6 | 9.7 | 1775 / N₂ |
| Example 73 | 9.2 | 60.7 | 29.6 | 9.7 | 1775 / N₂ |
| Example 74 | 8.4 | 60.7 | 29.6 | 9.7 | 1775 / N₂ |
| Example 75 | 10.3 | 60.7 | 29.6 | 9.7 | 1775 / Ar |
| Example 76 | 10.3 | 60.7 | 29.6 | 9.7 | 1700 / N₂ |
| Example 77 | 10.3 | 60.7 | 29.6 | 9.7 | 1850 / N₂ |
| Example 78 | 10.3 | Using second sintered body | | | 1650 / N₂ |
| Example 79 | 10.3 | Using second sintered body | | | 1775 / N₂ |
| Example 80 | 10.3 | Using second sintered body | | | 1850 / N₂ |
| Example 81 | 12.1 | 60.7 | 29.6 | 9.7 | 1775 / N₂ |
| Example 82 | 11.1 | 60.7 | 29.6 | 9.7 | 1775 / N₂ |
| Example 83 | 10.1 | 60.7 | 29.6 | 9.7 | 1775 / N₂ |
| Example 84 | 11.9 | 60.7 | 29.6 | 9.7 | 1775 / N₂ |
| Example 85 | 10.3 | 60.7 | 29.6 | 9.7 | 1775 / N₂ |
| Example 86 | 9.1 | 60.7 | 29.6 | 9.7 | 1775 / N₂ |
| Example 87 | 8.8 | 60.7 | 29.6 | 9.7 | 1775 / N₂ |
| Example 88 | 10.3 | 60.7 | 29.6 | 9.7 | 1775 / Ar |
| Example 89 | 10.3 | 60.7 | 29.6 | 9.7 | 1700 / N₂ |
| Example 90 | 10.3 | 60.7 | 29.6 | 9.7 | 1850 / N₂ |
| Example 91 | 10.3 | Using second sintered body | | | 1650 / N₂ |
| Example 92 | 10.3 | Using second sintered body | | | 1775 / N₂ |
| Example 93 | 10.3 | Using second sintered body | | | 1850 / N₂ |
| Example 94 | 10.5 | 60.7 | 29.6 | 9.7 | 1775 / N₂ |
| Example 95 | 11.0 | 60.7 | 29.6 | 9.7 | 1775 / N₂ |

*average thermal expansion coefficient of electrode component and filler component

TABLE 7

| | First firing process | | | | | Second firing process Raw material of electrode | | | | | |
|---|---|---|---|---|---|---|---|---|---|---|---|
| | Raw material of first compact | | | First firing condition | | First electrode component | | | Second electrode component | | |
| | MgO (mass %) | Al₂O₃ (mass %) | AlN (mass %) | First firing temperature (°C.) | Firing atmosphere | Kind | Thermal expansion coefficient (ppm/K) | Amount (% by volume) | Kind | Thermal expansion coefficient (ppm/K) | Amount (% by volume) |
| Example 96 | 85.0 | 11.3 | 3.7 | 1775 | N₂ | TiN | 9.0 | 18 | Ru | 8.4 | 18 |
| Example 97 | 60.7 | 29.6 | 9.7 | 1775 | N₂ | TiN | 9.0 | 27 | Ru | 8.4 | 27 |
| Example 98 | 49.0 | 28.2 | 22.8 | 1775 | N₂ | TiN | 9.0 | 40 | Ru | 8.4 | 40 |
| Example 99 | 60.7 | 29.6 | 9.7 | 1775 | N₂ | TiN | 9.0 | 18 | Ru | 8.4 | 18 |
| Example 100 | 60.7 | 29.6 | 9.7 | 1775 | N₂ | TiN | 9.0 | 35 | Ru | 8.4 | 35 |

TABLE 7-continued

| | | | | | | | | | | | |
|---|---|---|---|---|---|---|---|---|---|---|---|
| Example 101 | 60.7 | 29.6 | 9.7 | 1775 | $N_2$ | TiN | 9.0 | 40 | Ru | 8.4 | 40 |
| Example 102 | 60.7 | 29.6 | 9.7 | 1775 | $N_2$ | TiN | 9.0 | 50 | Ru | 8.4 | 50 |
| Example 103 | 60.7 | 29.6 | 9.7 | 1775 | $N_2$ | TiN | 9.0 | 70 | Ru | 8.4 | 10 |
| Example 104 | 60.7 | 29.6 | 9.7 | 1775 | $N_2$ | TiN | 9.0 | 55 | Ru | 8.4 | 25 |
| Example 105 | 60.7 | 29.6 | 9.7 | 1775 | $N_2$ | TiN | 9.0 | 25 | Ru | 8.4 | 55 |
| Example 106 | 60.7 | 29.6 | 9.7 | 1775 | $N_2$ | TiN | 9.0 | 10 | Ru | 8.4 | 70 |
| Example 107 | 60.7 | 29.6 | 9.7 | 1775 | Ar | TiN | 9.0 | 35 | Ru | 8.4 | 35 |
| Example 108 | 60.7 | 29.6 | 9.7 | 1700 | $N_2$ | TiN | 9.0 | 35 | Ru | 8.4 | 35 |
| Example 109 | 60.7 | 29.6 | 9.7 | 1850 | $N_2$ | TiN | 9.0 | 35 | Ru | 8.4 | 35 |
| Example 110 | 60.7 | 29.6 | 9.7 | 1775 | $N_2$ | TiN | 9.0 | 35 | Ru | 8.4 | 35 |
| Example 111 | 60.7 | 29.6 | 9.7 | 1775 | $N_2$ | TiN | 9.0 | 35 | Ru | 8.4 | 35 |
| Example 112 | 60.7 | 29.6 | 9.7 | 1775 | $N_2$ | TiN | 9.0 | 35 | Ru | 8.4 | 35 |

| | Second firing process | | | | | | | |
|---|---|---|---|---|---|---|---|---|
| | Raw material of electrode | | | Raw material of second compact | | | Second firing condition | |
| | Filler component | | Average thermal expansion coefficient of electrode* D (ppm/K) | | | | Second firing temperature (° C.) | Firing atmosphere |
| | Kind | Thermal expansion coefficient (ppm/K) | Amount (% by volume) | | MgO (mass %) | Al₂O₃ (mass %) | AlN (mass %) | | |
| Example 96 | MgO | 13.9 | 64 | 12.0 | 85.0 | 11.3 | 3.7 | 1775 | $N_2$ |
| Example 97 | MgO | 13.9 | 46 | 11.1 | 60.7 | 29.6 | 9.7 | 1775 | $N_2$ |
| Example 98 | MgO | 13.9 | 20 | 9.7 | 49.0 | 28.2 | 22.8 | 1775 | $N_2$ |
| Example 99 | MgO | 13.9 | 64 | 12.0 | 60.7 | 29.6 | 9.7 | 1775 | $N_2$ |
| Example 100 | MgO | 13.9 | 30 | 10.3 | 60.7 | 29.6 | 9.7 | 1775 | $N_2$ |
| Example 101 | MgO | 13.9 | 20 | 9.7 | 60.7 | 29.6 | 9.7 | 1775 | $N_2$ |
| Example 102 | MgO | 13.9 | 0 | 8.7 | 60.7 | 29.6 | 9.7 | 1775 | $N_2$ |
| Example 103 | MgO | 13.9 | 20 | 9.9 | 60.7 | 29.6 | 9.7 | 1775 | $N_2$ |
| Example 104 | MgO | 13.9 | 20 | 9.8 | 60.7 | 29.6 | 9.7 | 1775 | $N_2$ |
| Example 105 | MgO | 13.9 | 20 | 9.7 | 60.7 | 29.6 | 9.7 | 1775 | $N_2$ |
| Example 106 | MgO | 13.9 | 20 | 9.6 | 60.7 | 29.6 | 9.7 | 1775 | $N_2$ |
| Example 107 | MgO | 13.9 | 30 | 10.3 | 60.7 | 29.6 | 9.7 | 1775 | Ar |
| Example 108 | MgO | 13.9 | 30 | 10.3 | 60.7 | 29.6 | 9.7 | 1700 | $N_2$ |
| Example 109 | MgO | 13.9 | 30 | 10.3 | 60.7 | 29.6 | 9.7 | 1850 | $N_2$ |
| Example 110 | MgO | 13.9 | 30 | 10.3 | Using second sintered body | | | 1650 | $N_2$ |
| Example 111 | MgO | 13.9 | 30 | 10.3 | Using second sintered body | | | 1775 | $N_2$ |
| Example 112 | MgO | 13.9 | 30 | 10.3 | Using second sintered body | | | 1850 | $N_2$ |

*average thermal expansion coefficient of electrode component and filler component

TABLE 8

| | First firing process | | | | | Second firing process | | |
|---|---|---|---|---|---|---|---|---|
| | Raw material of first compact | | | First firing condition | | Raw material of electrode | | |
| | | | | | | Electrode component | | |
| | MgO (mass %) | Al₂O₃ (mass %) | AlN (mass %) | First firing temperature (° C.) | Firing atmosphere | Kind | Thermal expansion coefficient (ppm/K) | Amount (% by volume) |
| Comparative example 7 | 60.7 | 29.6 | 9.7 | 1775 | $N_2$ | Mo | 5.7 | 44 |
| Comparative example 8 | 60.7 | 29.6 | 9.7 | 1775 | $N_2$ | Mo | 5.7 | 44 |
| Comparative example 9 | 60.7 | 29.6 | 9.7 | 1775 | $N_2$ | Mo | 5.7 | 44 |
| Comparative example 10 | 60.7 | 29.6 | 9.7 | 1775 | $N_2$ | Mo | 5.7 | 44 |
| Comparative example 11 | 60.7 | 29.6 | 9.7 | 1775 | $N_2$ | W | 4.9 | 40 |
| Comparative example 12 | 60.7 | 29.6 | 9.7 | 1775 | $N_2$ | W | 4.9 | 40 |
| Comparative example 13 | 60.7 | 29.6 | 9.7 | 1775 | $N_2$ | W | 4.9 | 40 |
| Comparative example 14 | 60.7 | 29.6 | 9.7 | 1775 | $N_2$ | W | 4.9 | 40 |
| Comparative example 15 | 60.7 | 29.6 | 9.7 | 1775 | $N_2$ | Ru | 8.4 | 65 |

TABLE 8-continued

| | | | | | | | | |
|---|---|---|---|---|---|---|---|---|
| Comparative example 16 | 60.7 | 29.6 | 9.7 | 1775 | $N_2$ | Ru | 8.4 | 65 |
| Comparative example 17 | 60.7 | 29.6 | 9.7 | 1775 | $N_2$ | Ru | 8.4 | 65 |
| Comparative example 18 | 60.7 | 29.6 | 9.7 | 1775 | $N_2$ | Ru | 8.4 | 65 |
| Comparative example 19 | 60.7 | 29.6 | 9.7 | 1775 | $N_2$ | Ir | 8.8 | 70 |
| Comparative example 20 | 60.7 | 29.6 | 9.7 | 1775 | $N_2$ | Ir | 8.8 | 70 |
| Comparative example 21 | 60.7 | 29.6 | 9.7 | 1775 | $N_2$ | Ir | 8.8 | 70 |
| Comparative example 22 | 60.7 | 29.6 | 9.7 | 1775 | $N_2$ | Ir | 8.8 | 70 |

| | Second firing process | | | | | | | |
|---|---|---|---|---|---|---|---|---|
| | Raw material of electrode | | | | | | | |
| | Filler component | | Average thermal expansion coefficient of electrode* | Raw material of second compact | | | Second firing condition | |
| | | Thermal expansion | | | | | Second firing | |
| | Kind | coefficient (ppm/K) | Amount (% by volume) | D (ppm/K) | MgO (mass %) | $Al_2O_3$ (mass %) | AlN (mass %) | temperature (° C.) | Firing atmosphere |
| Comparative example 7 | MgO | 13.9 | 56 | 10.3 | 60.7 | 29.6 | 9.7 | 1600 | $N_2$ |
| Comparative example 8 | MgO | 13.9 | 56 | 10.3 | 60.7 | 29.6 | 9.7 | 1900 | $N_2$ |
| Comparative example 9 | MgO | 13.9 | 56 | 10.3 | Using second sintered body | | | 1600 | $N_2$ |
| Comparative example 10 | MgO | 13.9 | 56 | 10.3 | Using second sintered body | | | 1900 | $N_2$ |
| Comparative example 11 | MgO | 13.9 | 60 | 10.3 | 60.7 | 29.6 | 9.7 | 1600 | $N_2$ |
| Comparative example 12 | MgO | 13.9 | 60 | 10.3 | 60.7 | 29.6 | 9.7 | 1900 | $N_2$ |
| Comparative example 13 | MgO | 13.9 | 60 | 10.3 | Using second sintered body | | | 1600 | $N_2$ |
| Comparative example 14 | MgO | 13.9 | 60 | 10.3 | Using second sintered body | | | 1900 | $N_2$ |
| Comparative example 15 | MgO | 13.9 | 35 | 10.3 | 60.7 | 29.6 | 9.7 | 1600 | $N_2$ |
| Comparative example 16 | MgO | 13.9 | 35 | 10.3 | 60.7 | 29.6 | 9.7 | 1900 | $N_2$ |
| Comparative example 17 | MgO | 13.9 | 35 | 10.3 | Using second sintered body | | | 1600 | $N_2$ |
| Comparative example 18 | MgO | 13.9 | 35 | 10.3 | Using second sintered body | | | 1900 | $N_2$ |
| Comparative example 19 | MgO | 13.9 | 30 | 10.3 | 60.7 | 29.6 | 9.7 | 1600 | $N_2$ |
| Comparative example 20 | MgO | 13.9 | 30 | 10.3 | 60.7 | 29.6 | 9.7 | 1900 | $N_2$ |
| Comparative example 21 | MgO | 13.9 | 30 | 10.3 | Using second sintered body | | | 1600 | $N_2$ |
| Comparative example 22 | MgO | 13.9 | 30 | 10.3 | Using second sintered body | | | 1900 | $N_2$ |

*average thermal expansion coefficient of electrode component and filler component (Electric Resistivity)

A rectangular parallelepiped test specimen having a width of 9 mm, a length of 9 mm, and a thickness of approximately 6 mm was cut out from the integrated ceramic member including the electrode. The test specimen included an electrode having a width of 5 mm, a length of 9 mm, and a thickness in the range of approximately 30 to 50 μm. In the test specimens according to Examples 1 to 112 and Comparative Examples 1 to 22, the center of the electrode in the width direction coincided with the center of the test specimen in the width direction, and the electrode was exposed at both ends in the longitudinal direction. In the measurement of electric resistivity, a lead wire was connected to both ends of the test specimen in the longitudinal direction (exposed surfaces of the electrode) with an electrically conductive paste to form a circuit. While a small electric current in the range of 100 to 10 mA was passed through a test specimen in the air at room temperature (20° C.), a small voltage was measured to calculate electrode resistance R. The specific resistance ρ (Ωcm) was calculated using the equation ρ=R× S/L, wherein R (Ω) denotes electrical resistance, S (cm²) denotes the area of an exposed surface of the electrode, and L (cm) denotes the length of the electrode.

(Microstructure Evaluation after Burying Electrode)

The integrated ceramic member including the electrode was cut so as to expose the electrode. The section was mirror-polished and was checked for a crack in the ceramic base around the electrode with a scanning electron microscope (SEM). The reactivity between the electrode component and the ceramic base was evaluated with EPMA.

(XRD Analysis of Electrode)

The integrated ceramic member including the electrode was cut so as to expose the electrode. After the section was polished, the electrode was analyzed with an X-ray diffractometer to identify a crystal phase. The measurement conditions included CuKα, 40 kV, 40 mA, 2θ=5 to 70 degrees, and a step width of 0.02 degrees. A sealed-tube X-ray diffractometer (D8 Advance manufactured by Bruker AXS K.K.) was used.

(Measurement of Thermal Expansion Coefficient of Ceramic Base)

The thermal expansion coefficient of a ceramic base was determined by forming a sintered body using the same method as in the first sintered body and measuring the thermal expansion coefficient of the sintered body using a method according to JIS-R1618 at a temperature in the range of 40 to 1000° C.

(Evaluation of Crack)

A portion including the electrode was cut out from the integrated ceramic member including the electrode. The section of the portion was mirror-polished. The mirror-polished surface was observed with an electron microscope (SEM, manufactured by Royal Philips Electronics, XL30). A SEM image was checked for a crack. The absence of a crack was indicated by "No", and the presence of a crack was indicated by "Yes".

(Poor Bonding)

A portion including the electrode was cut out from the integrated ceramic member including the electrode. The section of the portion was mirror-polished. The mirror-polished surface was observed with an electron microscope (SEM, manufactured by Royal Philips Electronics, XL30). The bonding was examined in a SEM image. A sample having no gap having a length of 5 μm or more between base materials was rated good (◦) (a gap having a length of 5 μm or less was considered to be the falling of grains). A sample having a gap having a length of 5 μm or more between base materials was rated poor (x).

(Evaluation of Reactivity)

The reactivity between the electrode component and the base material of the integrated ceramic member including the electrode was studied. A cross section was observed with an electron microscope (SEM, XL30 manufactured by Royal Philips Electronics). The inclusion of an element of the electrode in the base material was examined in an elementary analysis with EPMA (JXA-8800RL manufactured by JEOL Ltd.) in the vicinity of the interface between the electrode and the base material. A sample containing no electrode component in the base material was rated good (◦). A sample containing an electrode component diffused in the base material within the range of 100 μm or less was rated fair (Δ). A sample containing an electrode component diffused in the base material within the range of 100 μm or more was rated poor (x).

(Results of Evaluation)

Tables 9 to 14 show the evaluation results of Examples 1 to 112 and Comparative Examples 1 to 22, such as the thermal expansion coefficient C (ppm/K) of the ceramic bases, the average thermal expansion coefficient D (ppm/K) calculated in consideration of the amounts of electrode component and filler component, the absolute value of the difference in thermal expansion coefficient between the ceramic base and the electrode (C–D) (ppm/K), the specific resistance (Ωcm) of the electrode of the integrated ceramic member, the presence or absence of a crack, the occurrence of poor bonding, and the presence or absence of a reaction between the electrode component and the base material. Examples 1 to 112 in Tables 9 to 13 show that the nitride, carbide, and metals in the examples did not cause a crack in the ceramic base, thus resulting in a low resistance of $1 \times 10^{-2}$ Ωcm or less. The EPMA analysis of the integrated ceramic member showed that the diffusion of an electrode component in the ceramic base was insignificant. The XRD analysis of the electrode of the integrated ceramic member showed that the electrode component in the ceramic base had the same crystal phase as its raw material. These results indicate that the nitride, carbide, and metals had low reactivity to Mg(Al)O(N). In these examples, the absolute value |C–D| of the difference between the thermal expansion coefficient C of the ceramic base and the average thermal expansion coefficient D of the electrode containing the filler component in a metal was 3.0 ppm/K or less, and the absolute value |C–D| of the difference between the thermal expansion coefficient C of the ceramic base and the average thermal expansion coefficient D of the electrode containing the filler component in a nitride, carbide, or carbonitride was 0.8 ppm/K or less. Thus, the mixing ratio of the filler component to the electrode component can be controlled as described above to suppress the occurrence of a crack. Since metals are more flexible than ceramics, such as nitrides, carbides, and carbonitrides, metals allow a greater difference in thermal expansion coefficient. Although the raw materials of the first and second sintered bodies had different compositions in Examples 5 and 7, the raw materials had substantially the same thermal expansion coefficient, and there was no crack due to the thermal expansion difference after sintering. Thus, even having different compositions, the first sintered body and the second sintered body having a small difference in thermal expansion coefficient can be integrated into a ceramic member. Tables 9 and 14 shows that Comparative Examples 1 to 4, which contained a silicide (such as $WSi_2$, $MoSi_2$, or $NbSi_2$) or a boride (such as $TiB_2$, $ZrB_2$, $NbB_2$, or $TaB_2$) as a raw material of the electrode component, had a crack in the ceramic base around the electrode. The EPMA analysis of the integrated ceramic members showed the diffusion of a Si or B component in the ceramic base within the range of 100 μm or more. A heterophase that was not contained in the electrode component was detected in the XRD analysis. For the electrode component composed of $MoSi_2$, silicon nitride and $Si_3Al_7O_3N_9$ were detected. For the electrode component composed of $TiB_2$, BN was detected. These results indicate that Si or B in the silicide or boride reacted with Mg(Al)O(N) in the ceramic base and formed a crystal phase having a low thermal expansion, thereby causing a crack. Furthermore, the diffusion of these components may affect volume resistivity or corrosion resistance. Thus, silicides and borides are not suitable for the electrode component. Comparative Example 5, in which the absolute value |C–D| of the difference between the thermal expansion coefficient C of the ceramic base and the average thermal expansion coefficient D of the electrode containing the filler component was 0.9 ppm/K, had a crack in the ceramic base. In Comparative Example 6, in which the filler component constituted 85% by volume of the electrode raw material, the electrode had no electrical conductivity. Comparative Examples 7 to 22, in which the firing temperature was 1650° C. or 1900° C., had poor bonding between the base materials or had a crack. Ni or Co used in common electrodes, such as $Al_2O_3$, has a lower melting point than the firing temperature and melted and flowed out of the sintered body during firing.

TABLE 9

Integrated ceramic member

| | Thermal expansion coefficient of ceramic base C (ppm/K) | Average thermal expansion coefficient of electrode*[1] D (ppm/K) | Absolute value of difference |C − D| (ppm/K) | Crack*[2] | Poor bonding*[3] | Reactivity of electrode component and base material*[4] | Specific resistance of electrode (Ωcm) | Remarks |
|---|---|---|---|---|---|---|---|---|
| Example 1 | 12.8 | 12.4 | 0.4 | No | ○ | ○ | 1.0E−03 | — |
| Example 2 | 11.1 | 10.7 | 0.4 | No | ○ | ○ | 9.0E−04 | — |
| Example 3 | 10.2 | 10.1 | 0.1 | No | ○ | ○ | 3.0E−04 | — |
| Example 4 | 11.1 | 11.0 | 0.1 | No | ○ | ○ | 7.0E−04 | — |
| Example 5 | 11.1 | 10.8 | 0.3 | No | ○ | ○ | 8.6E−04 | — |
| Example 6 | 10.2 | 9.8 | 0.4 | No | ○ | Δ | 3.0E−04 | — |
| Example 7 | 11.1 | 10.9 | 0.2 | No | ○ | Δ | 1.0E−03 | — |
| Example 8 | 10.2 | 9.9 | 0.3 | No | ○ | Δ | 7.0E−04 | — |
| Example 9 | 11.1 | 10.7 | 0.4 | No | ○ | Δ | 2.0E−03 | — |
| Example 10 | 10.2 | 9.9 | 0.3 | No | ○ | Δ | 6.0E−04 | — |
| Example 11 | 10.2 | 9.9 | 0.4 | No | ○ | Δ | 2.0E−03 | — |
| Example 12 | 10.2 | 9.8 | 0.4 | No | ○ | ○ | 1.0E−04 | — |
| Example 13 | 10.2 | 9.9 | 0.4 | No | ○ | ○ | 2.0E−04 | — |
| Example 14 | 11.1 | 10.7 | 0.4 | No | ○ | ○ | 1.0E−03 | — |
| Example 15 | 12.8 | 12.8 | 0.0 | No | ○ | ○ | 3.0E−04 | — |
| comparative example 1 | 10.2 | 10.0 | 0.2 | Yes | ○ | X | — | B component diffused within the range of 100 μm or more |
| comparative example 2 | 10.2 | 10.0 | 0.2 | Yes | ○ | X | — | |
| comparative example 3 | 11.1 | 10.7 | 0.4 | Yes | ○ | X | — | B component diffused within the range of 100 μm or more |
| comparative example 4 | 11.1 | 11.0 | 0.2 | Yes | ○ | X | — | |
| comparative example 5 | 10.2 | 9.3 | 0.9 | Yes | ○ | ○ | — | — |
| comparative example 6 | 12.8 | 12.7 | 0.1 | No | ○ | ○ | No electrical conductivity | — |

*[1] average thermal expansion coefficient of electrode component and filler component
*[2] checking for crack from cross-sectional microstructure of a integrated ceramic member (a buried electrode body)
*[3] checking for presence or absence of a gap having a length of 5 μm or more
*[4] checking for reactivity of the electrode and the base material based on the range of diffusion, no diffusion of electrode components is ○, diffusion within the range of 100 μm or less is Δ, 100 μm or more is Δ.

TABLE 10

Integrated ceramic member

| | Thermal expansion coefficient of ceramic base C (ppm/K) | Average thermal expansion coefficient of electrode*[1] D (ppm/K) | Absolute value of difference |C − D| (ppm/K) | Crack*[2] | Poor bonding*[3] | Reactivity of electrode component and base material*[4] | Specific resistance of electrode (Ωcm) | Remarks |
|---|---|---|---|---|---|---|---|---|
| Example 16 | 11.1 | 11.1 | 0.0 | No | ○ | ○ | 4.0E−04 | — |
| Example 17 | 11.1 | 11.8 | 0.7 | No | ○ | ○ | 5.0E−04 | — |
| Example 18 | 11.1 | 10.3 | 0.8 | No | ○ | ○ | 3.5E−04 | — |
| Example 19 | 11.1 | 10.3 | 0.8 | No | ○ | ○ | 3.5E−04 | — |
| Example 20 | 11.1 | 10.3 | 0.8 | No | ○ | ○ | 3.5E−04 | — |
| Example 21 | 11.1 | 10.3 | 0.8 | No | ○ | ○ | 3.5E−04 | — |
| Example 22 | 11.1 | 10.3 | 0.8 | No | ○ | ○ | 1.0E−04 | — |
| Example 23 | 11.1 | 10.3 | 0.8 | No | ○ | ○ | 1.0E−04 | — |
| Example 24 | 11.1 | 10.3 | 0.8 | No | ○ | ○ | 1.0E−04 | — |
| Example 25 | 12.8 | 12.0 | 0.8 | No | ○ | ○ | 9.0E−04 | — |
| Example 26 | 10.2 | 10.2 | 0.0 | No | ○ | ○ | 5.0E−04 | — |
| Example 27 | 11.1 | 11.9 | 0.8 | No | ○ | ○ | 8.5E−04 | — |
| Example 28 | 11.1 | 10.3 | 0.8 | No | ○ | ○ | 5.0E−04 | — |
| Example 29 | 11.1 | 10.3 | 0.8 | No | ○ | ○ | 5.0E−04 | — |
| Example 30 | 11.1 | 10.3 | 0.8 | No | ○ | ○ | 5.0E−04 | — |
| Example 31 | 11.1 | 10.3 | 0.8 | No | ○ | ○ | 5.0E−04 | — |
| Example 32 | 11.1 | 10.3 | 0.8 | No | ○ | ○ | 3.0E−05 | — |
| Example 33 | 11.1 | 10.3 | 0.8 | No | ○ | ○ | 3.0E−05 | — |
| Example 34 | 11.1 | 10.3 | 0.8 | No | ○ | ○ | 3.0E−05 | — |
| Example 35 | 11.1 | 10.3 | 0.8 | No | ○ | ○ | 1.5E−04 | — |
| Example 36 | 11.1 | 11.0 | 0.1 | No | ○ | ○ | 3.0E−04 | — |
| Example 37 | 11.1 | 9.1 | 2.0 | No | ○ | ○ | 9.0E−05 | — |
| Example 38 | 11.1 | 10.3 | 0.8 | No | ○ | ○ | 1.5E−04 | — |
| Example 39 | 11.1 | 10.3 | 0.8 | No | ○ | ○ | 1.5E−04 | — |
| Example 40 | 11.1 | 10.3 | 0.8 | No | ○ | ○ | 1.5E−04 | — |

TABLE 10-continued

| | Integrated ceramic member | | | | | | | |
|---|---|---|---|---|---|---|---|---|
| | Thermal expansion coefficient of ceramic base C (ppm/K) | Average thermal expansion coefficient of electrode*1 D (ppm/K) | Absolute value of difference \|C − D\| (ppm/K) | Crack*2 | Poor bonding*3 | Reactivity of electrode component and base material*4 | Specific resistance of electrode (Ωcm) | Remarks |
| Example 41 | 11.1 | 10.3 | 0.8 | No | ◯ | ◯ | 3.5E−05 | — |
| Example 42 | 11.1 | 10.3 | 0.8 | No | ◯ | ◯ | 3.5E−05 | — |
| Example 43 | 11.1 | 10.3 | 0.8 | No | ◯ | ◯ | 3.5E−05 | — |

*1 average thermal expansion coefficient of electrode component and filler component
*2 checking for crack from cross-sectional microstructure of a integrated ceramic member(a buried electrode body)
*3 checking for presence or absence of a gap having a length of 5 μm or more
*4 checking for reactivity of the electrode and the base material based on the range of diffusion, no diffusion of electrode components is ◯, diffusion within the range of 100 μm or less is Δ, 100 μm or more is ▲.

TABLE 11

| | Integrated ceramic member | | | | | | | |
|---|---|---|---|---|---|---|---|---|
| | Thermal expansion coefficient of ceramic base C (ppm/K) | Average thermal expansion coefficient of electrode*1 D (ppm/K) | Absolute value of difference \|C − D\| (ppm/K) | Crack*2 | Poor bonding*3 | Reactivity of electrode component and base material*4 | Specific resistance of electrode (Ωcm) | Remarks |
| Example 44 | 11.1 | 10.3 | 0.8 | No | ◯ | ◯ | 3.0E−04 | — |
| Example 45 | 11.1 | 10.8 | 0.4 | No | ◯ | ◯ | 5.0E−04 | — |
| Example 46 | 11.1 | 9.1 | 2.0 | No | ◯ | ◯ | 1.0E−04 | — |
| Example 47 | 11.1 | 10.3 | 0.8 | No | ◯ | ◯ | 3.0E−04 | — |
| Example 48 | 11.1 | 10.3 | 0.8 | No | ◯ | ◯ | 3.0E−04 | — |
| Example 49 | 11.1 | 10.3 | 0.8 | No | ◯ | ◯ | 3.0E−04 | — |
| Example 50 | 11.1 | 10.3 | 0.8 | No | ◯ | ◯ | 1.2E−05 | — |
| Example 51 | 11.1 | 10.3 | 0.8 | No | ◯ | ◯ | 1.2E−05 | — |
| Example 52 | 11.1 | 10.3 | 0.8 | No | ◯ | ◯ | 1.3E−05 | — |
| Example 53 | 12.1 | 11.0 | 1.1 | No | ◯ | ◯ | 1.2E−03 | — |
| Example 54 | 10.2 | 10.1 | 0.1 | No | ◯ | ◯ | 7.0E−04 | — |
| Example 55 | 11.1 | 11.9 | 0.8 | No | ◯ | ◯ | 2.0E−03 | — |
| Example 56 | 11.1 | 10.3 | 0.8 | No | ◯ | ◯ | 7.5E−04 | — |
| Example 57 | 11.1 | 9.1 | 2.0 | No | ◯ | ◯ | 3.0E−04 | — |
| Example 58 | 11.1 | 10.3 | 0.8 | No | ◯ | ◯ | 8.0E−04 | — |
| Example 59 | 11.1 | 10.3 | 0.8 | No | ◯ | ◯ | 8.0E−04 | — |
| Example 60 | 11.1 | 10.3 | 0.8 | No | ◯ | ◯ | 8.0E−04 | — |
| Example 61 | 11.1 | 10.3 | 0.8 | No | ◯ | ◯ | 8.0E−04 | — |
| Example 62 | 11.1 | 10.3 | 0.8 | No | ◯ | ◯ | 8.0E−04 | — |
| Example 63 | 11.1 | 10.3 | 0.8 | No | ◯ | ◯ | 8.0E−04 | — |
| Example 64 | 11.1 | 11.1 | 0.0 | No | ◯ | ◯ | 1.0E−04 | — |
| Example 65 | 11.1 | 10.4 | 0.7 | No | ◯ | ◯ | 2.0E−04 | — |
| Example 66 | 11.1 | 10.3 | 0.8 | No | ◯ | ◯ | 4.0E−04 | — |
| Example 67 | 11.1 | 10.3 | 0.8 | No | ◯ | ◯ | 5.0E−04 | — |
| Example 68 | 12.8 | 12.0 | 0.8 | No | ◯ | ◯ | 2.0E−04 | — |
| Example 69 | 11.1 | 11.2 | 0.1 | No | ◯ | ◯ | 1.0E−04 | — |
| Example 70 | 10.2 | 10.3 | 0.1 | No | ◯ | ◯ | 6.0E−05 | — |

*1 average thermal expansion coefficient of electrode component and filler component
*2 checking for crack from cross-sectional microstructure of a integrated ceramic member(a buried electrode body)
*3 checking for presence or absence of a gap having a length of 5 μm or more
*4 checking for reactivity of the electrode and the base material based on the range of diffusion, no diffusion of electrode components is ◯, diffusion within the range of 100 μm or less is Δ, 100 μm or more is ▲.

TABLE 12

| | Integrated ceramic member | | | | | | | |
|---|---|---|---|---|---|---|---|---|
| | Thermal expansion coefficient of ceramic base C (ppm/K) | Average thermal expansion coefficient of electrode*1 D (ppm/K) | Absolute value of difference \|C − D\| (ppm/K) | Crack*2 | Poor bonding*3 | Reactivity of electrode component and base material*4 | Specific resistance of electrode (Ωcm) | Remarks |
| Example 71 | 11.1 | 12.0 | 0.9 | No | ◯ | ◯ | 2.0E−04 | — |
| Example 72 | 11.1 | 10.3 | 0.8 | No | ◯ | ◯ | 6.0E−05 | — |
| Example 73 | 11.1 | 9.2 | 1.9 | No | ◯ | ◯ | 3.0E−05 | — |

TABLE 12-continued

Integrated ceramic member

| | Thermal expansion coefficient of ceramic base C (ppm/K) | Average thermal expansion coefficient of electrode*1 D (ppm/K) | Absolute value of difference \|C − D\| (ppm/K) | Crack*2 | Poor bonding*3 | Reactivity of electrode component and base material*4 | Specific resistance of electrode (Ωcm) | Remarks |
|---|---|---|---|---|---|---|---|---|
| Example 74 | 11.1 | 8.4 | 2.7 | No | ○ | ○ | 3.0E−05 | — |
| Example 75 | 11.1 | 10.3 | 0.8 | No | ○ | ○ | 6.0E−05 | — |
| Example 76 | 11.1 | 10.3 | 0.8 | No | ○ | ○ | 6.0E−05 | — |
| Example 77 | 11.1 | 10.3 | 0.8 | No | ○ | ○ | 6.0E−05 | — |
| Example 78 | 11.1 | 10.3 | 0.8 | No | ○ | ○ | 6.0E−05 | — |
| Example 79 | 11.1 | 10.3 | 0.8 | No | ○ | ○ | 4.0E−05 | — |
| Example 80 | 11.1 | 10.3 | 0.8 | No | ○ | ○ | 4.0E−05 | — |
| Example 81 | 12.8 | 12.1 | 0.7 | No | ○ | ○ | 1.0E−04 | — |
| Example 82 | 11.1 | 11.1 | 0.0 | No | ○ | ○ | 7.0E−05 | — |
| Example 83 | 10.2 | 10.1 | 0.1 | No | ○ | ○ | 5.0E−05 | — |
| Example 84 | 11.1 | 11.9 | 0.8 | No | ○ | ○ | 1.0E−04 | — |
| Example 85 | 11.1 | 10.3 | 0.8 | No | ○ | ○ | 6.0E−05 | — |
| Example 86 | 11.1 | 9.1 | 2.0 | No | ○ | ○ | 3.5E−05 | — |
| Example 87 | 11.1 | 8.8 | 2.3 | No | ○ | ○ | 3.0E−05 | — |
| Example 88 | 11.1 | 10.3 | 0.8 | No | ○ | ○ | 6.0E−05 | — |
| Example 89 | 11.1 | 10.3 | 0.8 | No | ○ | ○ | 6.0E−05 | — |
| Example 90 | 11.1 | 10.3 | 0.8 | No | ○ | ○ | 6.0E−05 | — |
| Example 91 | 11.1 | 10.3 | 0.8 | No | ○ | ○ | 6.0E−05 | — |
| Example 92 | 11.1 | 10.3 | 0.8 | No | ○ | ○ | 5.0E−05 | — |
| Example 93 | 11.1 | 10.3 | 0.8 | No | ○ | ○ | 5.0E−05 | — |
| Example 94 | 11.1 | 10.5 | 0.6 | No | ○ | ○ | 8.0E−05 | — |
| Example 95 | 11.1 | 11.0 | 0.1 | No | ○ | ○ | 1.5E−05 | — |

*1 average thermal expansion coefficient of electrode component and filler component
*2 checking for crack from cross-sectional microstructure of a integrated ceramic member(a buried electrode body)
*3 checking for presence or absence of a gap having a length of 5 μm or more
*4 checking for reactivity of the electrode and the base material based on the range of diffusion, no diffusion of electrode components is ○, diffusion within the range of 100 μm or less is Δ, 100 μm or more is ▲.

TABLE 13

Integrated ceramic member

| | Thermal expansion coefficient of ceramic base C (ppm/K) | Average thermal expansion coefficient of electrode*1 D (ppm/K) | Absolute value of difference \|C − D\| (ppm/K) | Crack*2 | Poor bonding*3 | Reactivity of electrode component and base material*4 | Specific resistance of electrode (Ωcm) | Remarks |
|---|---|---|---|---|---|---|---|---|
| Example 96 | 12.8 | 12.0 | 0.8 | No | ○ | ○ | 5.0E−04 | — |
| Example 97 | 11.1 | 11.1 | 0.0 | No | ○ | ○ | 3.0E−04 | — |
| Example 98 | 10.2 | 9.7 | 0.5 | No | ○ | ○ | 8.0E−05 | — |
| Example 99 | 11.1 | 12.0 | 0.9 | No | ○ | ○ | 5.0E−04 | — |
| Example 100 | 11.1 | 10.3 | 0.8 | No | ○ | ○ | 9.0E−05 | — |
| Example 101 | 11.1 | 9.7 | 1.4 | No | ○ | ○ | 7.5E−05 | — |
| Example 102 | 11.1 | 8.7 | 2.4 | No | ○ | ○ | 5.0E−05 | — |
| Example 103 | 11.1 | 9.9 | 1.2 | No | ○ | ○ | 3.0E−04 | — |
| Example 104 | 11.1 | 9.8 | 1.3 | No | ○ | ○ | 2.0E−04 | — |
| Example 105 | 11.1 | 9.7 | 1.5 | No | ○ | ○ | 7.5E−05 | — |
| Example 106 | 11.1 | 9.6 | 1.5 | No | ○ | ○ | 4.0E−05 | — |
| Example 107 | 11.1 | 10.3 | 0.8 | No | ○ | ○ | 9.0E−05 | — |
| Example 108 | 11.1 | 10.3 | 0.8 | No | ○ | ○ | 1.0E−04 | — |
| Example 109 | 11.1 | 10.3 | 0.8 | No | ○ | ○ | 9.0E−05 | — |
| Example 110 | 11.1 | 10.3 | 0.8 | No | ○ | ○ | 3.0E−05 | — |
| Example 111 | 11.1 | 10.3 | 0.8 | No | ○ | ○ | 2.5E−05 | — |
| Example 112 | 11.1 | 10.3 | 0.8 | No | ○ | ○ | 2.5E−05 | — |

*1 average thermal expansion coefficient of electrode component and filler component
*2 checking for crack from cross-sectional microstructure of a integrated ceramic member(a buried electrode body)
*3 checking for presence or absence of a gap having a length of 5 μm or more
*4 checking for reactivity of the electrode and the base material based on the range of diffusion, no diffusion of electrode components is ○, diffusion within the range of 100 μm or less is Δ, 100 μm or more is ▲.

TABLE 14

| | Integrated ceramic member | | | | | | | |
|---|---|---|---|---|---|---|---|---|
| | Thermal expansion coefficient of ceramic base C (ppm/K) | Average thermal expansion coefficient of electrode*1 D (ppm/K) | Absolute value of difference \|C − D\| (ppm/K) | Crack*2 | Poor bonding*3 | Reactivity of electrode component and base material*4 | Specific resistance of electrode (Ωcm) | Remarks |
| Comparative example 7 | 11.1 | 10.3 | 0.8 | No | X | ○ | — | — |
| Comparative example 8 | 11.1 | 10.3 | 0.8 | Yes | ○ | ○ | — | — |
| Comparative example 9 | 11.1 | 10.3 | 0.8 | No | X | ○ | — | — |
| Comparative example 10 | 11.1 | 10.3 | 0.8 | Yes | ○ | ○ | — | — |
| Comparative example 11 | 11.1 | 10.3 | 0.8 | No | X | ○ | — | — |
| Comparative example 12 | 11.1 | 10.3 | 0.8 | Yes | ○ | ○ | — | — |
| Comparative example 13 | 11.1 | 10.3 | 0.8 | No | X | ○ | — | — |
| Comparative example 14 | 11.1 | 10.3 | 0.8 | Yes | ○ | ○ | — | — |
| Comparative example 15 | 11.1 | 10.3 | 0.8 | No | X | ○ | — | — |
| Comparative example 16 | 11.1 | 10.3 | 0.8 | Yes | ○ | ○ | — | — |
| Comparative example 17 | 11.1 | 10.3 | 0.8 | No | X | ○ | — | — |
| Comparative example 18 | 11.1 | 10.3 | 0.8 | Yes | ○ | ○ | — | — |
| Comparative example 19 | 11.1 | 10.3 | 0.8 | No | X | ○ | — | — |
| Comparative example 20 | 11.1 | 10.3 | 0.8 | Yes | ○ | ○ | — | — |
| Comparative example 21 | 11.1 | 10.3 | 0.8 | No | X | ○ | — | — |
| Comparative example 22 | 11.1 | 10.3 | 0.8 | Yes | ○ | ○ | — | — |

*1 average thermal expansion coefficient of electrode component and filler component
*2 checking for crack from cross-sectional microstructure of a integrated ceramic member (a buried electrode body)
*3 checking for presence or absence of a gap having a length of 5 μm or more
*4 checking for reactivity of the electrode and the base material based on the range of diffusion, no diffusion of electrode components is ○, diffusion within the range of 100 μm or less is △, 100 μm or more is ▲.

The present application claims priority from Japanese Patent Application No. 2011-223851 filed on Oct. 11, 2011, the entire contents of which are incorporated herein by reference.

INDUSTRIAL APPLICABILITY

A ceramic member according to the present invention is used in members for semiconductor manufacturing apparatuses, such as electrostatic chucks, susceptors, heaters, plates, inner wall materials, monitoring windows, microwave entrance windows, and microwave coupling antennas.

REFERENCE SIGNS LIST

20 member for semiconductor manufacturing apparatus, 22 base material portion, 24 thorough-hole, 26 electric supply member, 30 ceramic member, 32 ceramic base, 34 electrode.

What is claimed is:

1. A ceramic member comprising;
a ceramic base which contains a solid solution Mg(Al)O(N) in which Al and N components are dissolved in magnesium oxide as a main phase, and,
an electrode disposed on a portion of the ceramic base and containing at least one of nitrides, carbides, carbonitrides, and metals as an electrode component,
wherein the ceramic base comprises, of the mixed powder composition, 49 mass % to 99 mass % magnesium oxide, 0.5 mass % to 25 mass % aluminum nitride, and 0.5 mass % to 30 mass % alumina, and
wherein an XRD peak of a (111), (200), or (220) plane of the Mg(Al)O(N) measured using a CuKα ray at 2θ=36.9 to 39, 42.9 to 44.8, or 62.3 to 65.2 degrees, respectively, between a magnesium oxide cubic crystal peak and an aluminum nitride cubic crystal peak.

2. The ceramic member according to claim 1, having the XRD peaks of the (200) plane and the (220) plane of the Mg(Al)O(N) at 2θ=42.92 degrees or more and 62.33 degrees or more, respectively.

3. The ceramic member according to claim 1, wherein the integral width of the XRD peak of the (200) plane of the Mg(Al)O(N) is 0.50 degrees or less.

4. The ceramic member according to claim 1, wherein the ceramic base contains no AlN crystal phase.

5. The ceramic member according to claim 1, wherein the ceramic base contains a Mg—Al oxynitride phase which has the XRD peak at least at 2θ=47 to 49 degrees measured using a CuKα ray as a subphase.

6. The ceramic member according to claim 5, wherein a ratio A/B of the XRD peak intensity A of the Mg—Al oxynitride phase at 2θ=47 to 49 degrees to the XRD peak intensity B of the (220) plane of the Mg(Al)O(N) at 2θ=62.3 to 65.2 degrees is 0.03 or more.

7. The ceramic member according to claim 6, wherein the A/B is 0.14 or less.

8. The ceramic member according to claim 1, wherein the electrode contains at least one of nitrides, carbides, carbonitrides and metals containing at least one of Ti, Zr, Hf, V, Nb, Ta, Cr, Mo, and W as the electrode component.

9. The ceramic member according to claim 1, wherein the electrode component of the electrode has a thermal expansion coefficient of 4.0 ppm/K or more.

10. The ceramic member according to claim 1, wherein the electrode contains the electrode component and a filler component containing Mg and O.

11. The ceramic member according to claim 1, wherein the electrode has a specific resistance of 10 Ωcm or less.

12. The ceramic member according to claim 1, wherein an absolute value of the difference in thermal expansion coefficient between the ceramic base and raw material components of the electrode is 0.8 ppm/K or less.

13. A member for semiconductor manufacturing apparatus including the ceramic member according to claim 1.

14. A method for manufacturing a ceramic member according to claim 1, comprising;
   placing an electrode raw material containing at least one of nitrides, carbides, carbonitrides, and metals on a portion of a ceramic compact or a sintered body containing Mg, O, Al, and N components, and,
   cofiring the ceramic compact or the sintered body containing Mg, O, Al, and N components.

15. The method for manufacturing the ceramic member according to claim 14, wherein the compact is fired with a hot press.

\* \* \* \* \*